(12) United States Patent
Yoshimoto et al.

(10) Patent No.: US 7,119,635 B2
(45) Date of Patent: Oct. 10, 2006

(54) ELECTRONIC COMPONENT

(75) Inventors: Masahiro Yoshimoto, Miyazaki (JP); Kuniaki Kiyosue, Miyazaki (JP); Nobuaki Nagai, Miyazaki (JP); Tokuji Nishino, Koyu-gun (JP); Shinichirou Kaneko, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/926,289

(22) Filed: Aug. 26, 2004

(65) Prior Publication Data

US 2005/0046517 A1 Mar. 3, 2005

(30) Foreign Application Priority Data

Aug. 29, 2003 (JP) ............ P. 2003-306658
Feb. 25, 2004 (JP) ............ P. 2004-049665
Jun. 2, 2004 (JP) ............ P. 2004-164212

(51) Int. Cl.
H03H 7/01 (2006.01)
H01F 27/29 (2006.01)

(52) U.S. Cl. .............. 333/185; 333/175; 336/192

(58) Field of Classification Search ........... 333/177, 333/181, 185, 175; 336/83, 96, 192, 200, 336/223
See application file for complete search history.

(56) References Cited

U.S. PATENT DOCUMENTS

| | | | |
|---|---|---|---|
| 3,783,417 A * | 1/1974 | Osada et al. ............... | 333/185 |
| 4,881,050 A | 11/1989 | Swanson, Jr. | |
| 5,602,517 A * | 2/1997 | Kaneko et al. ........... | 333/185 |
| 5,764,126 A * | 6/1998 | Kanetaka et al. ........ | 336/96 |
| 6,476,689 B1 * | 11/2002 | Uchida et al. ........... | 333/177 |
| 6,486,853 B1 | 11/2002 | Yoshinomoto et al. | |
| 6,492,885 B1 | 12/2002 | Murata et al. | |
| 6,621,378 B1 * | 9/2003 | Naruse et al. .......... | 333/185 |
| 2001/0022547 A1 | 9/2001 | Murata et al. | |
| 2002/0137467 A1 | 9/2002 | Tzannes | |
| 2003/0011532 A1 | 1/2003 | Yoshinomoto et al. | |
| 2003/0043732 A1 | 3/2003 | Walton et al. | |
| 2003/0079904 A1 | 5/2003 | Sato et al. | |

FOREIGN PATENT DOCUMENTS

EP  0785559  7/1997

(Continued)

OTHER PUBLICATIONS

PCT International Search Report dated Nov. 30, 2004.

(Continued)

*Primary Examiner*—Seungsook Ham
(74) *Attorney, Agent, or Firm*—Stevens, Davis, Miller & Mosher, LLP

(57) ABSTRACT

An electronic component of the invention has: a substrate; first to third terminal portions disposed on the substrate; and at least one spiral conductor portion disposed between the first and second terminal portions. The third terminal portion is not electrically connected to other portions of the substrate, and the first and second terminal portions are electrically connected to or disconnected from each other. In the electronic component, the number of production steps is smaller, the cost is lower, and a more highly accurate inductor component is realized as compared with a laminated electronic component in which emphasis is put on increase of the capacitor component. It is possible to realize an electronic component having accurate band- or low-pass filter characteristics.

9 Claims, 27 Drawing Sheets

| | FOREIGN PATENT DOCUMENTS | |
|---|---|---|
| JP | 01259518 | 10/1989 |
| JP | 2000341069 | 12/2000 |
| JP | 2002009572 A * | 1/2002 |
| JP | 2003 78377 | 3/2003 |
| WO | 9810545 | 3/1998 |

OTHER PUBLICATIONS

International Search Report dated Apr. 8, 2005.
Robert C. Weast; "CRC Handbook of Chemistry and Physics, 63rd Edition," 1982, CRC Press, Boca Raton, ISBN: 0-8493-0463-6, p. E-56.

* cited by examiner

ELECTRONIC COMPONENT

BACKGROUND OF THE INVENTION

The present invention relates to an electronic component which is preferably used in, for example, an electronic apparatus conducting radio communication, such as a mobile communication terminal or a personal computer, and which compositely includes an inductor and a capacitor.

In a cordless telephone or a cellular telephone, in order to lower the cost and miniaturize the telephone, it is requested to reduce the sizes and number of components. In a portable electronic apparatus such as a notebook personal computer, data communication using a wireless LAN or the like is often conducted, and hence also components in such an electronic apparatus are requested to be reduced in size and number.

In such communication, an electronic component which compositely includes an inductor and a capacitor is necessary. Electronic components of this kind are often used as various filter circuits in a radio communication circuit for the purpose of selectively allowing a signal in a desired frequency band to pass therethrough, and attenuating an unwanted signal. Filters include a band-pass filter through which only a signal in a specific frequency band can be passed, a low-pass filter through which only a signal in a lower frequency band can be passed, and a high-pass filter through which only a signal in a higher frequency band can be passed.

Conventionally, a filter is sometimes configured by using an inductor component and a capacitor component which are discrete chip components, to form an LC circuit on a circuit board of a wireless apparatus. Also a dielectric filter and a surface acoustic wave filter which are configured respectively by single elements, and a composite electronic component having a filter function of a dielectric filter, such as a multilayer LC filter are used. In order to cope with various frequency characteristics, particularly, a multilayer LC filter is often used in an electronic component.

FIG. 30 is a section view of a multilayer LC filter of the conventional art, and FIG. 31 is a perspective view of a multilayer LC filter of the conventional art. (See, for example, JP-A-2000-341069 or JP-A-1-259518)

Attenuation characteristics and attenuation curve characteristics which are required in a filter are determined by an equivalent circuit of an inductor component L and a capacitor component C, and their values. When one of the values of the components is changed, it is possible to obtain desired filter characteristics. In order to realize a filter which can be used in the GHz band or the like, an impedance of a certain level or higher is required, and therefore, the inductor value or the capacitor value must be adequately controlled.

In the case where a filter is configured by a laminated element, however, the inductor component L is formed by printing or the like in a laminated member, and hence the value is inevitably small. In order to obtain necessary attenuation characteristics, therefore, the capacitor component must be increased. As a result, the material of the laminated member must be improved, and the number of laminations in the laminated member must be increased, so that the production step number and the cost are additionally required, thereby causing a problem in that the reductions of the size and the cost are inevitably limited.

In an element in which miniaturization of a certain level is requested, moreover, there is a problem in that further size reduction is naturally limited.

In pattern printing for producing an inductor component, for example, a printed pattern which is to be formed in a laminated member to produce an inductor component must be formed before a process of firing the laminated member, and hence problems such as that the value of the inductor component is unavoidably changed after a lamination process occur. Therefore, it is difficult to realize a highly accurate filter.

In a conventional electronic component such as a multilayer LC filter, as seen from the section view of FIG. 30, electrodes are configured inside a ceramic member, and hence complicated production steps must be conducted, so that it is difficult to reduce the cost. Because the production steps are complicated and the step number is increased, the steps have many causes of dispersing characteristics. In joining to an external circuit, although the impedance must be matched with that of a circuit pattern on a circuit board, circuit constants in a filter cannot be finely adjusted, and hence an external matching circuit is additionally required. As a result, it is difficult to reduce the size of a portable terminal.

As apparent also from the perspective view of FIG. 31, the inductance is configured in a planar form. In order to obtain a large inductance value, therefore, a large pattern must be formed, thereby causing a problem in that it is difficult to suppress an electronic component to a small size.

By contrast, when an LC circuit is configured by discrete chip components, arbitrary circuit constants can be obtained, and the degree of freedom in design of a circuit on a circuit board is enhanced. However, the number of components is larger than that in the case where a composite component is used, thereby causing a problem in that the mounting area is widened and a circuit board and hence an electronic apparatus are hardly miniaturized. Of course, there is a further problem in that the large number of components causes the cost to be increased.

In an attenuation curve showing filter characteristics, a pole is formed. It is requested to obtain desired attenuation characteristics by adjusting the formation of a pole. In order to realize this, the inductor and capacitor components must be adjusted. In a conventional laminated component, it is difficult to conduct this adjustment, and there is a problem in that such adjustment of the inductor and capacitor components may not result in adjustment of the formation of a pole, but in variation of the cutoff frequency.

SUMMARY OF THE INVENTION

It is an object of the invention to provide an electronic component which can reduce the size and cost of an electronic apparatus such as a portable terminal while sufficiently ensuring the degree of freedom in design of a circuit board to be used in a radio communication apparatus.

According to the invention, an electronic component including a first substrate on which a first terminal portion is disposed; a second substrate which is capacitively coupled to said first substrate, and on which a second terminal portion is disposed; and at least one spiral conductor portion disposed in at least one of a surface of said first substrate and a surface of said second substrate.

An element is configured by a single substrate, labors and costs are not consumed in works such as lamination, attention is focused on an inductor component constituting a filter and an inductor component of a capacitor component, and a spiral conductor portion is formed in the outer periphery of the substrate, whereby, in place of the capacitor component, the inductor component is increased, so that an electronic component of a low cost can be realized. When the spiral conductor portion is formed on the substrate by trimming or the like, an inductor component of high accuracy can be ensured unlike the case of firing. Since the first and second terminal portions are not connected to each other, the component can operate as a band-pass filter.

Preferably, in the electronic component, the spiral conductor portion is disposed in each of areas between the first terminal portion and the first groove portion, and between the second terminal portion and the first groove portion, and placed mirror-symmetrically about said first groove portion.

Thus, the third terminal portion is further disposed, and the first to third terminal portions are not connected to each other. Therefore, an electronic component serving as a band-pass filter can be similarly realized. An electronic component in which it is not required to consider the mounting directionality can be formed.

Only the third terminal portion is set to an independent state where the portion is not connected to other portions of the substrate, whereby an electronic component having an equivalent circuit of frequency characteristics equivalent to those of a low-pass filter can be realized. A configuration such as lamination for increasing the capacitor component is not required, and a highly accurate inductor component having a large value can be formed on the substrate. Therefore, an electronic component serving as a low-pass filter can be realized by a single element of a low cost and high accuracy.

BRIEF DESCRIPTION OF THE DRAWINGS

FIGS. 25A to 25C are section views of electronic components of Embodiment 3 of the invention, and.

DETAILED DESCRIPTION OF THE PREFERRED EMBODIMENTS (Embodiment 1)

Figure 1:
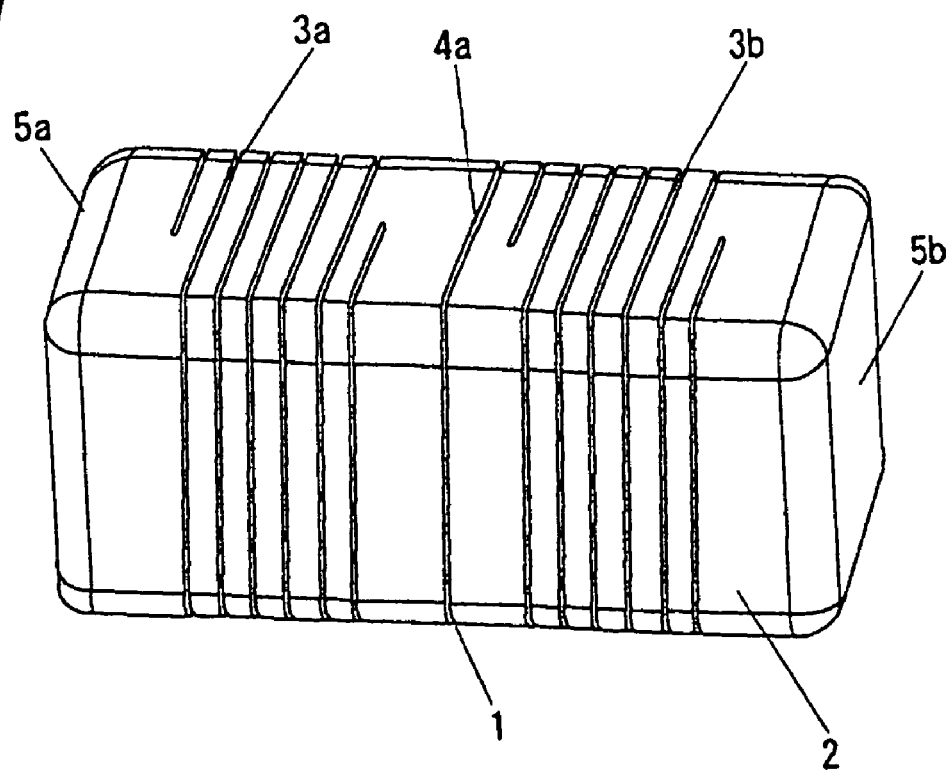
FIGS. 1 to 3 are perspective views of electronic components of Embodiment 1 of the invention.
Figure 2:
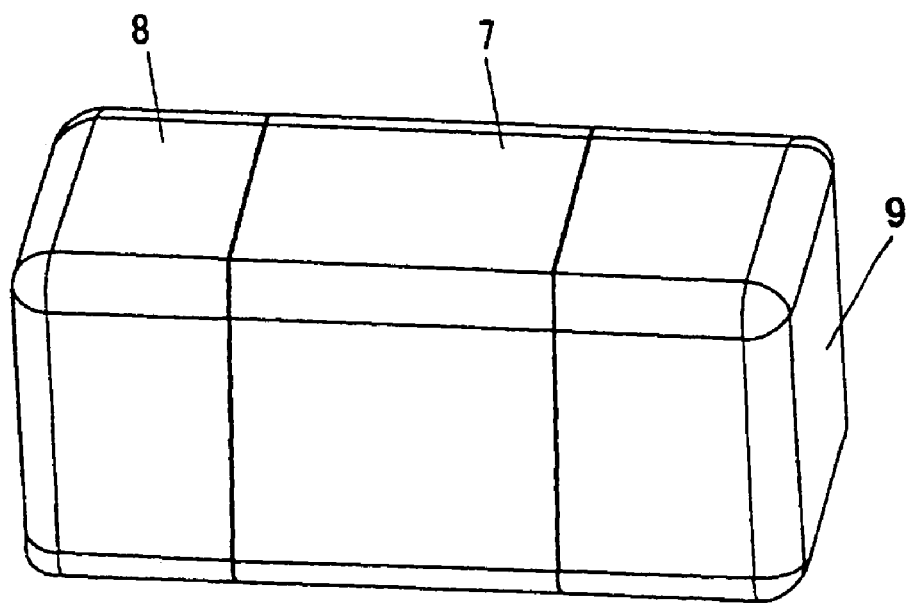
Figure 3:
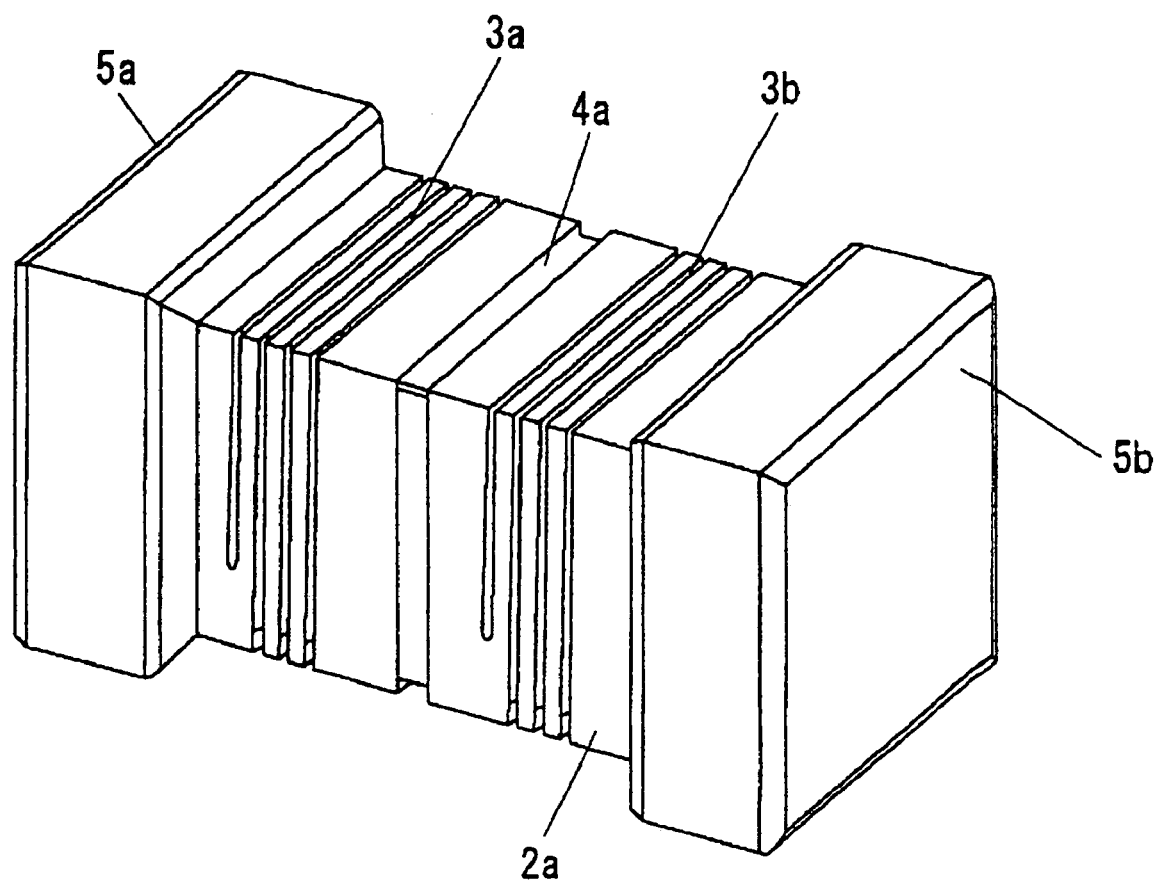
Figure 4:
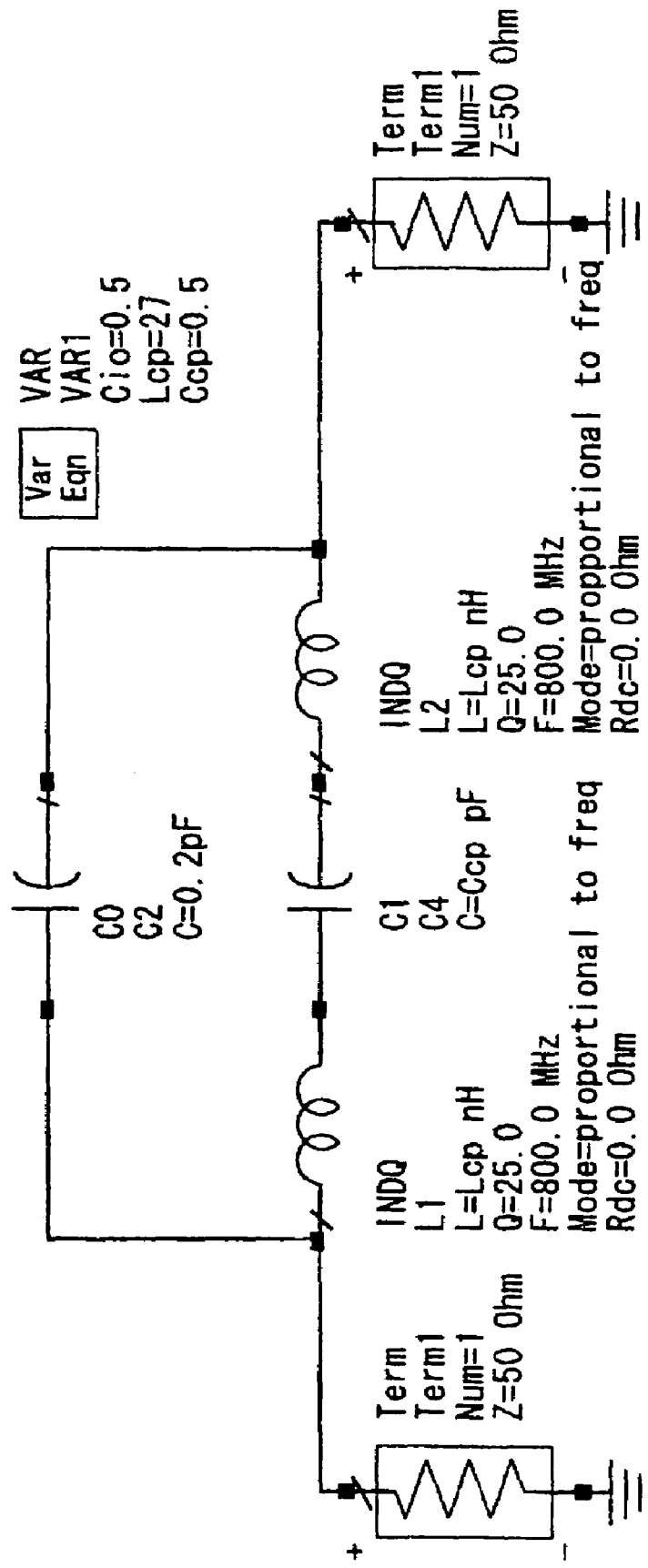
FIG. 4 is an equivalent circuit diagram of an electronic component of Embodiment 1 of the invention.

FIGS. 1 to 3 are perspective views of electronic components of Embodiment 1 of the invention, FIG. 4 is an equivalent circuit diagram of an electronic component of Embodiment 1 of the invention, and FIG. 5 is a view showing results of simulations conducted in Embodiment 1 of the invention.

Referring to FIG. 1, 1 denotes an electronic component, 2 denotes a substrate, 3a, 3b denote spiral conductor portions, 4a denotes a first groove portion, and 5a, 5b denote a first terminal portion and a second terminal portion, respectively.

The substrate 2 is made of an insulative material. As the material of the substrate 2, preferably useful are materials such as barium titanate, alumina, an alumina-based material, forsterite, magnetic ferrite, and silicon oxide. When a dielectric material essentially comprising barium titanate having a large specific dielectric constant is used, particularly, a large capacitance can be obtained. When alumina or an alumina-based material is used, it is possible to obtain an electronic component which is useful for high frequency applications, and which has high strength and excellent workability. One or more layers of a conductive film made of a conductive material such as copper, silver, gold, or nickel are laminated on the whole substrate 2 to form a conductive surface. The conductive film is formed by a method such as plating, vapor deposition, sputtering, pasting, CVD, or printing. Preferably, ceramics useful as the material of the substrate has a specific dielectric constant of about 1 to 150.

In FIG. 1, the substrate 2 is formed as a rectangular prism. Alternatively, the substrate maybe formed as a triangular prism, a column, or a polygonal prism having five or more edges.

The spiral conductor portions 3a, 3b are disposed over the whole outer periphery of the substrate 2 to form an inductance component. For example, the inductance value can be adjusted by adjusting the number of turns, the groove width, and the groove depth in each of the spiral conductor portions 3a, 3b. The spiral conductor portions 3a, 3b are formed in areas between the first groove portion 4a, and the first and second terminal portions. As shown in FIG. 1, the spiral conductor portions 3a, 3b may be disposed in the areas between the first groove portion 4a and the two terminal portions 5a, 5b, respectively, or alternatively may be disposed in only one of the areas between the first terminal portion 5a and the second terminal portion 5b, and the first groove portion 4a. In the case where the spiral conductor portions 3a, 3b are disposed in both the areas between the first terminal portion 5a and the second terminal portion 5b, and the first groove portion, the spiral conductor portions are formed so as to be symmetrical about the first groove portion 4a, thereby forming a symmetrical circuit centered at the first groove portion 4a. Consequently, it is possible to eliminate the mounting directionality of the electronic component. Since the mounting directionality is eliminated, the electronic component can function as a filter which will be described later, and which exhibits the same characteristics irrespective of the mounting direction. Therefore, a failure in mounting the electronic component can be eliminated, with the result that the yield can be improved and the cost can be lowered.

Alternatively, two or more spiral portions may be disposed in each of the areas between the first terminal portion 5a and the second terminal portion 5b, and the first groove portion 4a.

In the first groove portion 4a, a coupling capacitance is generated between opposing faces to form a capacitor component. The capacitor value can be adjusted by adjusting the width of the first groove portion or the like, so that a capacitor component corresponding to the purpose can be formed.

The first terminal portion 5a and the second terminal portion 5b are made of a conductive material. In the case where a conductive film is formed on the surface of the substrate 2, for example, the first terminal portion 5a and the second terminal portion 5b can be realized by forming the conductive film, also on the surfaces corresponding to the terminal portions. Alternatively, conductive films of a larger number of layers may be formed in order to adjust the conductance performance or the strength. The first terminal portion 5a and the second terminal portion 5b are paired terminal portions which are disposed on the substrate 2, and usually formed on the both ends, respectively. In the case where a projection exists in the ends, for example, the terminal portions may be formed on portions other the ends. The first terminal portion 5a and the second terminal portion 5b may be formed on the end and side faces of the substrate 2. Alternatively, the conductive film may not be formed on the end faces of the substrate 2, and may be formed only on the side faces, or only on a part of the side faces.

A resonance state is caused by the inductor and capacitor components which are produced by the spiral conductor portions and the first groove portion as described above. In FIG. 1, the inductor value of the spiral conductor portion 3a is L1, the inductor value of the spiral conductor portion 3b is L2, and the coupling capacitor value in the gap portion is C1. As a result, an equivalent circuit shown in FIG. 4 is obtained.

In the figure, C0 denotes a parasitic capacitance generated between terminals.

In this case, L1 and L2 are connected in series. Therefore, the impedance Z is indicated by (Exp. 1) using the combined inductance value and the capacitor value C1. The resonance frequency f0 is calculated by (Exp. 2) showing the resonance condition. As seen from (Exp. 1) and (Exp. 2), the impedance is minimum at the resonance frequency f0, the impedance with respect to a signal in this band is low, and that with respect to a signal in the other band is high.

$$Z = R + j\left(\omega L - \frac{1}{\omega C}\right) \quad \text{[Exp. 1]}$$

$$f_0 = \frac{1}{2\pi\sqrt{LC}} \quad \text{[Exp. 2]}$$

When the composite LC circuit 1 is mounted in a signal line, a signal is input to one of the first and second terminal portions 5a and 5b, and a signal is output from the other one of the terminal portions, the circuit functions as a band-pass filter through which only a signal in a specific frequency band can be passed.

FIG. 5 shows results of experiments which were conducted with using the electronic component 1 as a band-pass filter. The experiments were conducted under the conditions listed in FIG. 4 showing the equivalent circuit. FIG. 5A shows the pass band characteristics, FIG. 5B shows the broad band characteristics, FIG. 5C shows a return loss representation of the impedance characteristics of the pass band, and FIG. 5D shows a Smith chart representation of the impedance characteristics of the pass band.

Figure 5A:
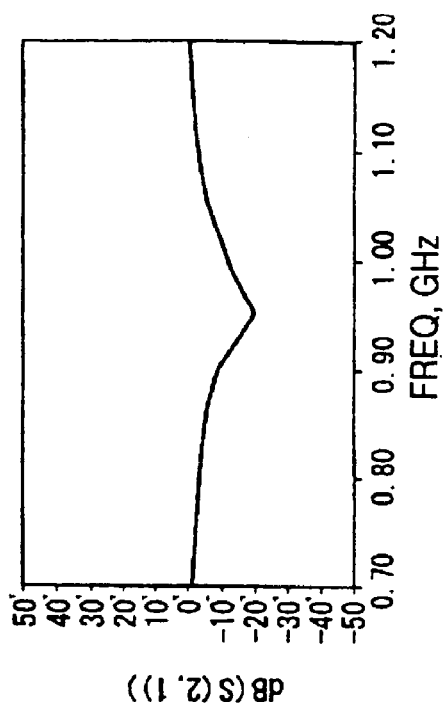
FIGS. 5A–5D are views showing results of simulations conducted in Embodiment 1 of the invention.
Figure 5B:
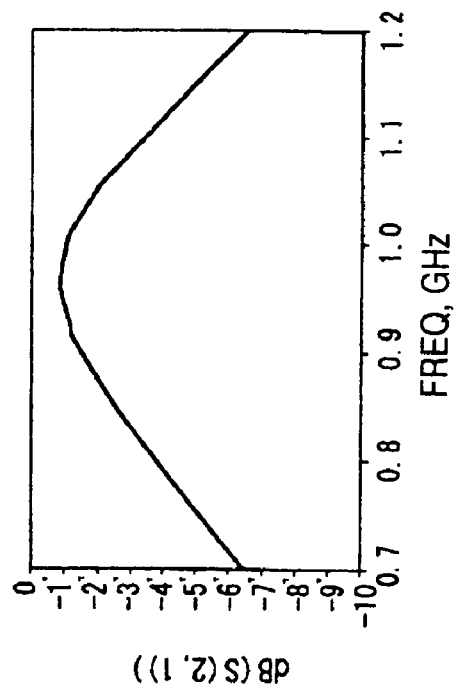
Figure 5C:
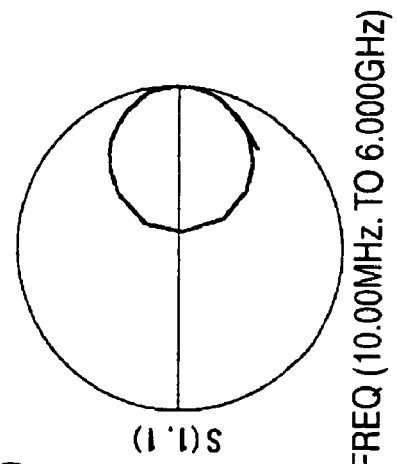
Figure 5D:
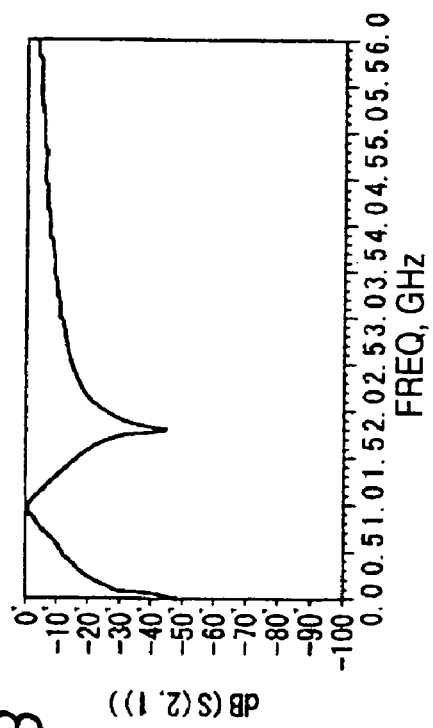

As seen from FIG. 5A, the electronic component functions as a band-pass filter through which a signal in the vicinity of 900 MHz can be band-passed. Since the inductor values L1, L2 and the capacitor value C1 are adjustable, the pass band frequency of the band-pass filter can be changed.

In Embodiment 1, the conductive film which is formed on a substantially whole face of the substrate 2 is trimmed by laser or grinding stone to be formed into the spiral conductor portions 3a, 3b and the first groove portion 4a. Alternatively, a resist pattern may be formed by the photolithography technique on the conductive film formed on a substantially whole face, and the conductor portions and groove portion may be then formed by the etching technique or the like.

FIG. 2 shows an electronic component in which a protective film is formed, and FIG. 3 shows an electronic component in which the whole periphery of the substrate 2 excluding the first and second terminal portions 5a and 5b is stepped down.

The reference numeral 7 denotes a protective film, and 8, 9 denote bonding films. The protective film 7 is disposed so as to cover at least the spiral conductor portions 3a, 3b and the first groove portion 4a. Of course, the protective film 7 may be disposed on the whole periphery of the substrate 2 excluding the first and second terminal portions 5a and 5b. The protective film 7 is made of an insulative material. A resin or ceramic is preferably used as the material. Specific examples are a resin material such as an epoxy resin, and an insulating film of silicon oxide or the like.

The protective film 7 is formed by any one of various methods including application, electrodeposition, and electrostatic coating. Alternatively, the protective film may be formed by using a tubular protective film. The tubular protective film can be realized by attaching a protective film having a tubular shape to the periphery of the substrate 2, and then applying heat to cause the film to be in close contact with the substrate. The tubular protective film is formed so as to cover the spiral conductor portions and the first groove portion, and hence does not flow into grooves of the spiral conductor portions and the first groove portion. Therefore, the inductor characteristics are not varied by the disposition of the tubular protective film. Preferably, a material which is made of a resin and heat-shrinkable is selected as the material of the tubular protective film because of the following reason. When the substrate 2 is covered by such a tubular protective film and a heat treatment is applied to the film, the tubular film shrinks so that the tubular protective film can be surely formed on the substrate 2.

As the coating composition, preferably, one of an electrodepositable coating composition, a transfer coating composition, glass, and low-temperature fired ceramics is used, or a combination of these materials is used.

Since the protective film 7 is disposed, the conductive film of the substrate 2, the spiral conductor portions, the groove of the first groove portion 4a, and the like can be prevented from being damaged. Particularly, they can be protected from shocks and heat during transportation and a mounting process.

The bonding films 8, 9 are configured by so-called lead-free solder in which only Sn is used or elements other than lead are added to Sn. In the embodiment, the bonding films are disposed in order to improve the bonding property in, for example, a process of mounting the electronic component onto a circuit board. In the case where the bonding property is sufficiently attained by the first and second terminal portions 5a and 5b, it is not necessary to dispose the bonding films 8, 9. More preferably, a film of nickel or a nickel alloy may be disposed between the first and second terminal portions 5a and 5b and the bonding films 8, 9 in order to prevent solder leaching from occurring, and improve, for example, the weather resistance of the first and second terminal portions 5a and 5b.

As shown in FIG. 3, it is preferable to form steps in the substrate 2 over the whole periphery except the first and second terminal portions 5a and 5b, because, when such steps are disposed, the spiral conductor portions are not in direct contact with the circuit board during the mounting process, and hence the characteristics are not adversely affected. In the case where the protective film 7 is disposed, the level of the protective film 7 is substantially equal to the levels of the first and second terminal portions 5a and 5b, and therefore a mounting failure does not occur in the first and second terminal portions 5a and 5b during the mounting process, and a problem such as element rising is not caused. Moreover, the protective film 7 can be thickened, so that the weather resistance of the spiral conductor portions 3a, 3b and the like can be improved. It is a matter of course that also the configuration in which the steps are formed can attain the same effects as those of configurations shown in FIGS. 1 and 2.

In the conventional art, the minimum size of an electronic component is 1608 size of a multilayer LC filter. By contrast, according to the embodiment of the invention, in 1005 size or 0603 size, it is possible to attain an inductance of 1 to 56 nH in the spiral conductor portions. In the case where ceramics having a specific dielectric constant of 1 to 150 is used as the material of the substrate, when the gap portion has a width of 0.01 to 0.1 mm, it is possible to attain a capacitance of 0.1 to 10 pF. Therefore, an electronic component of an ultra small size or 0603 size can be realized, so that a filter can be configured by a component which is very smaller than a conventional multilayer LC filter. Since the size of the component is small, the mounting area can be reduced, and also the whole size of an electronic apparatus into which the component is incorporated can be reduced.

(Embodiment 2)

Figure 8:
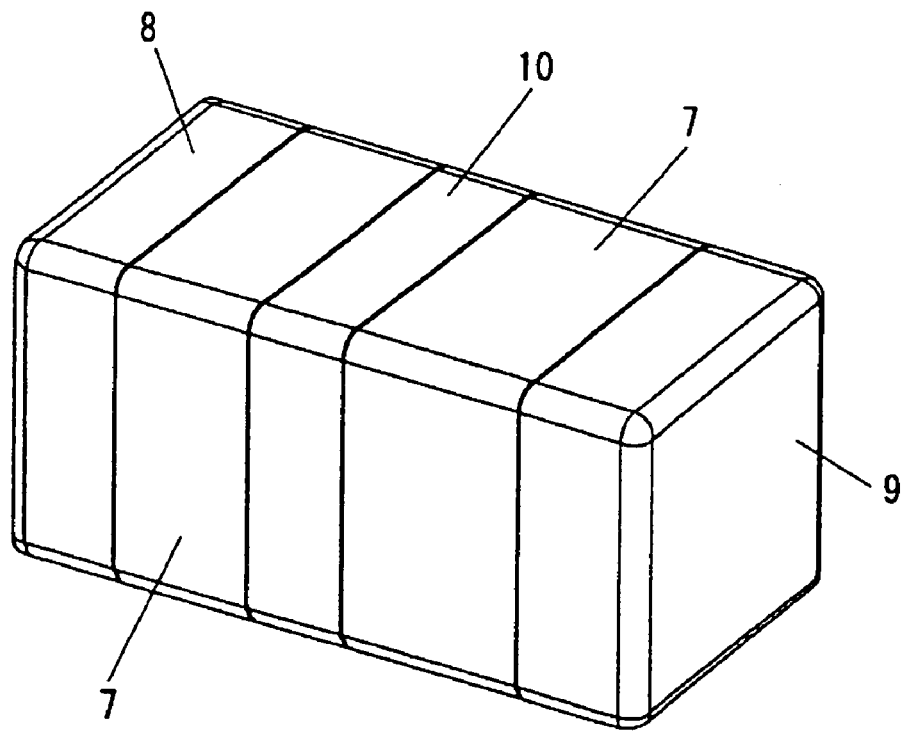
Figure 9:
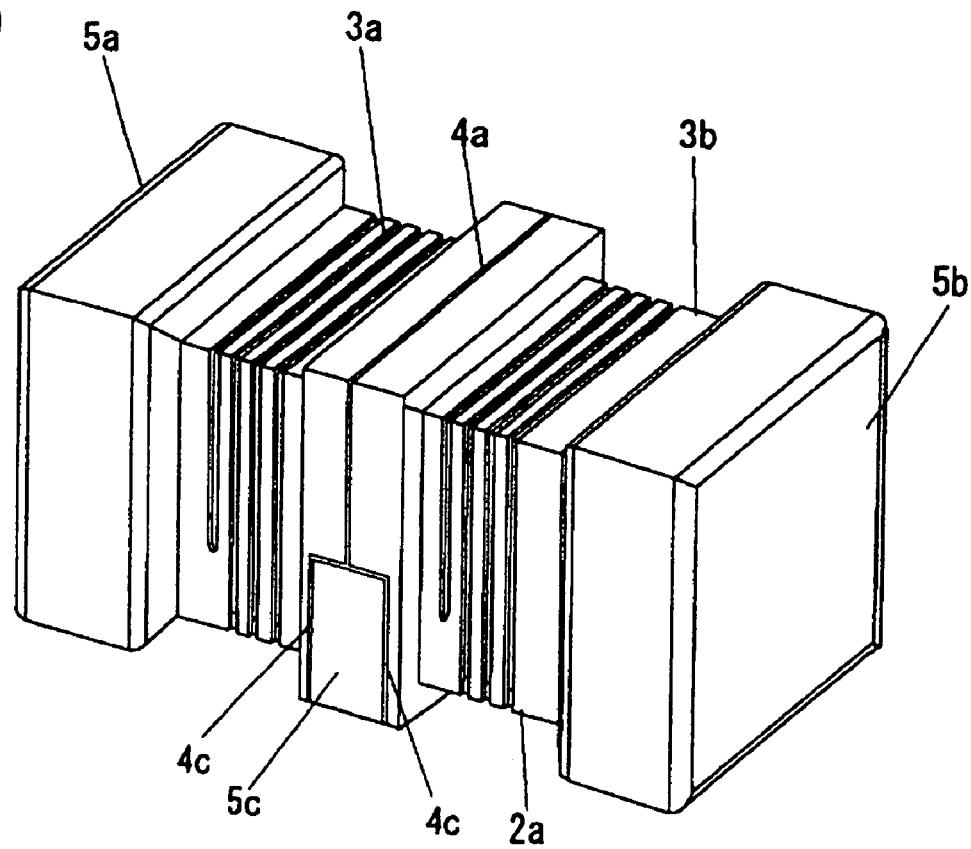
Figure 10:
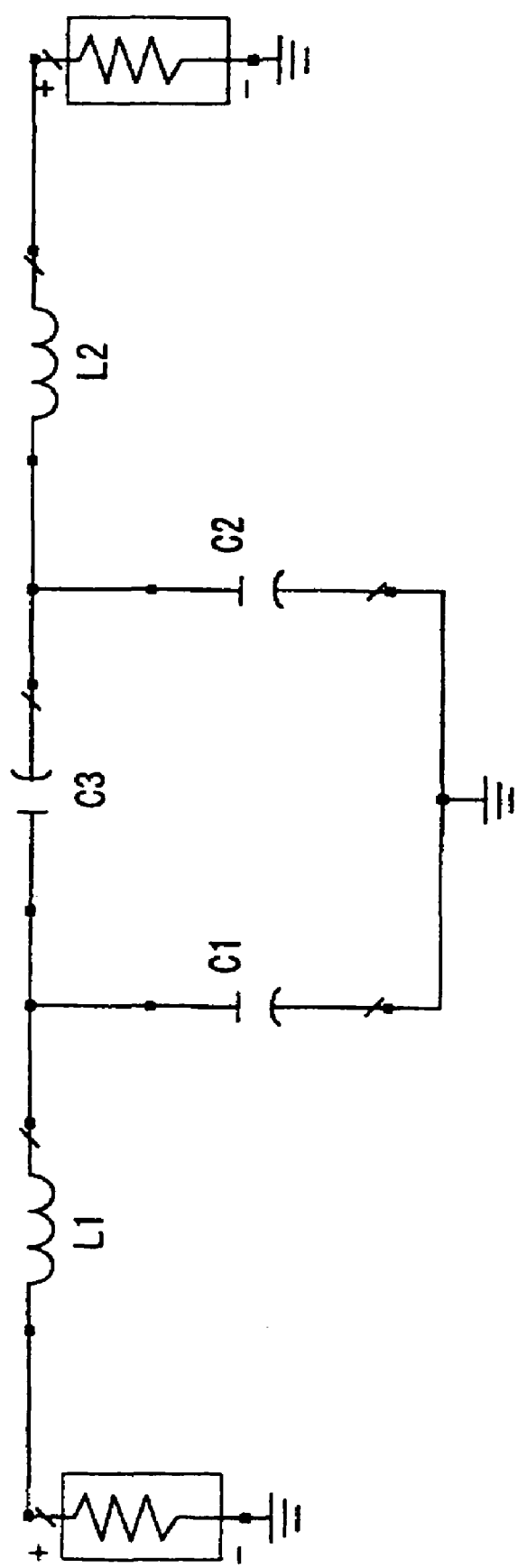
FIGS. 10 to 12 are equivalent circuit diagrams of electronic components of Embodiment 2 of the invention.
Figure 11:
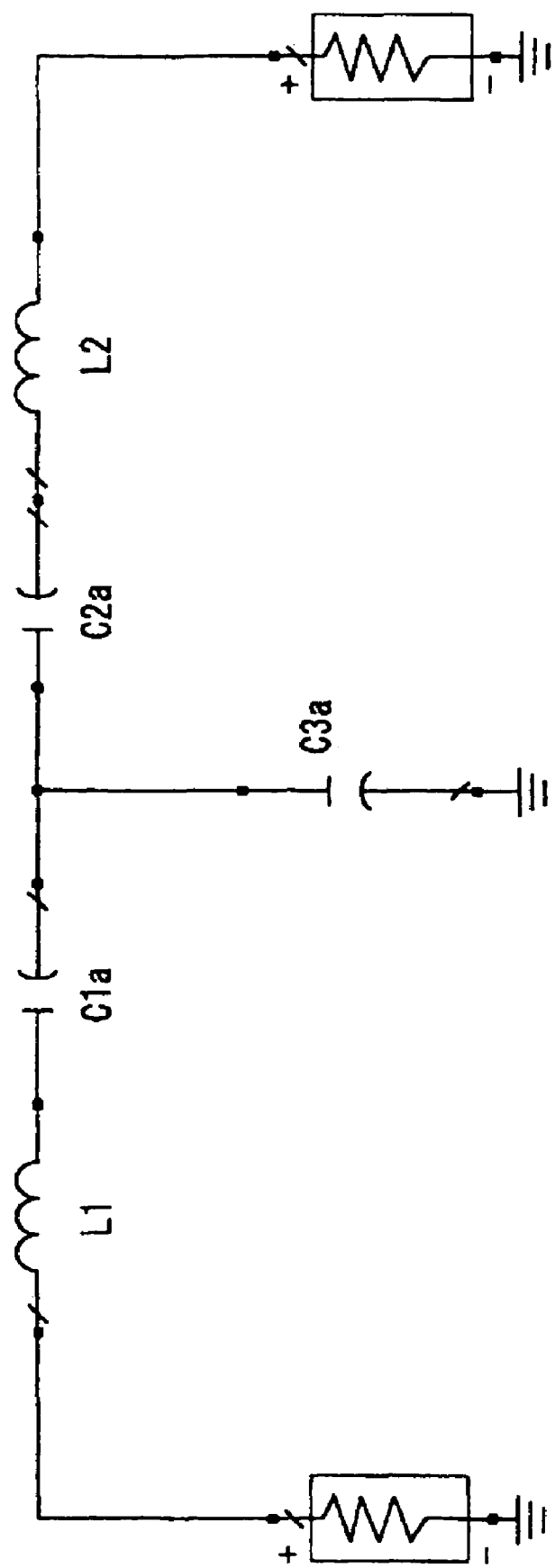
Figure 12:
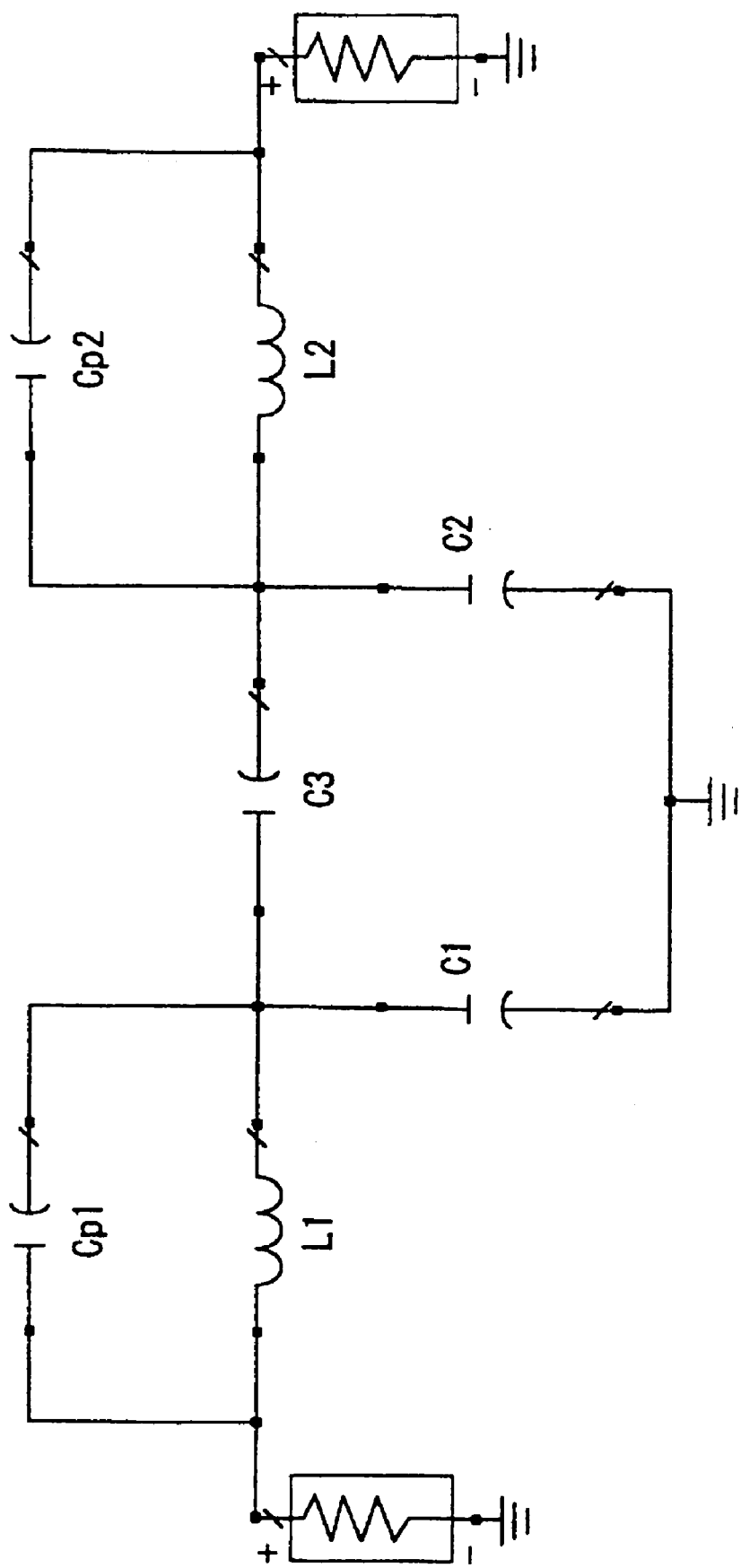
Figure 13:
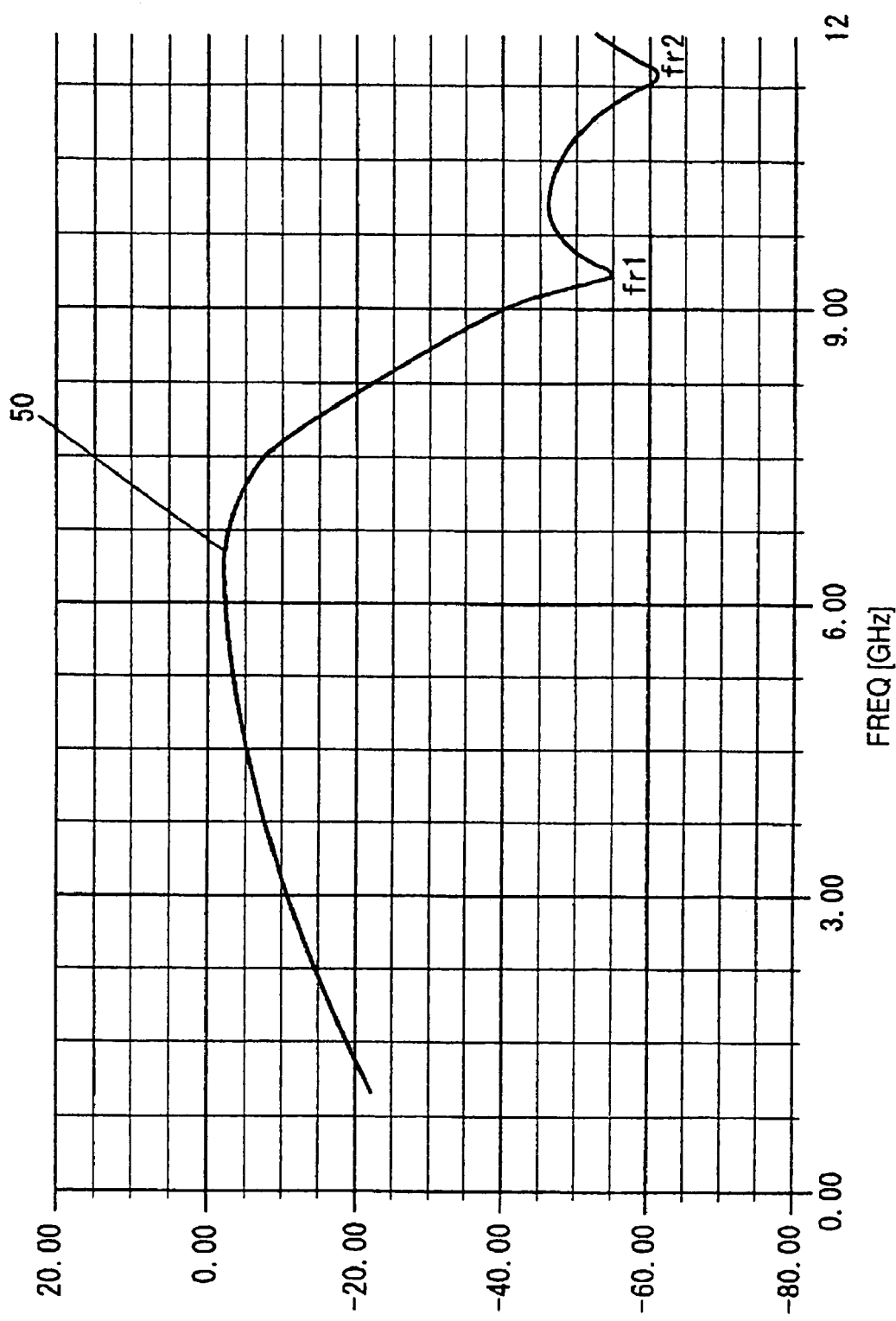
FIGS. 13 and 15 are views showing results of simulations conducted in Embodiment 2 of the invention.
Figure 14A:
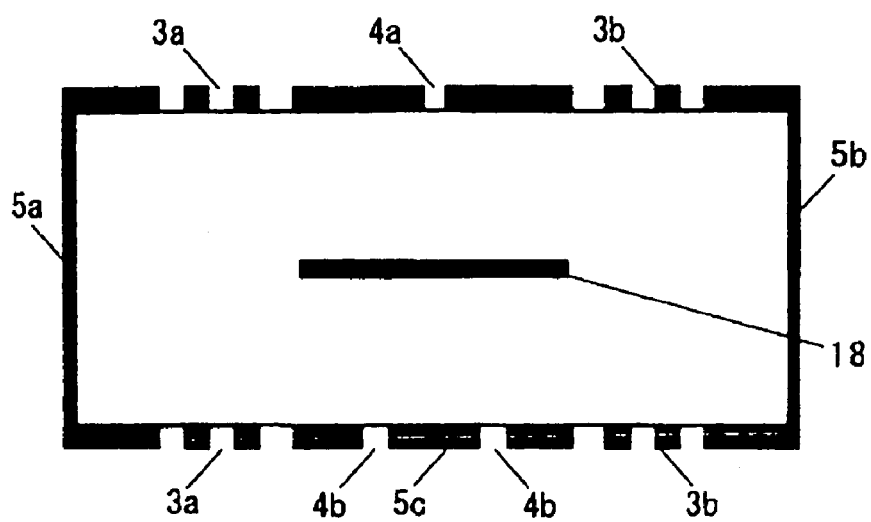
FIGS. 14A to 14C are section views of electronic components of Embodiment 2 of the invention.
Figure 14B:
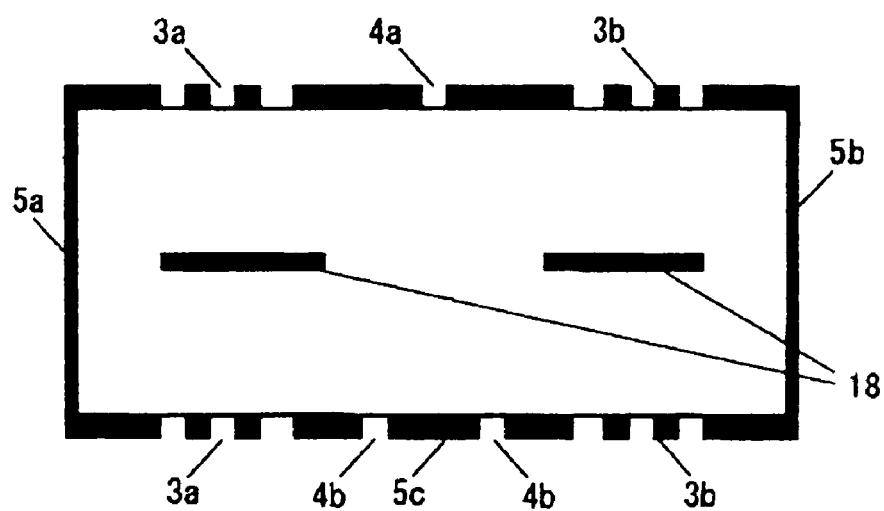
Figure 14C:
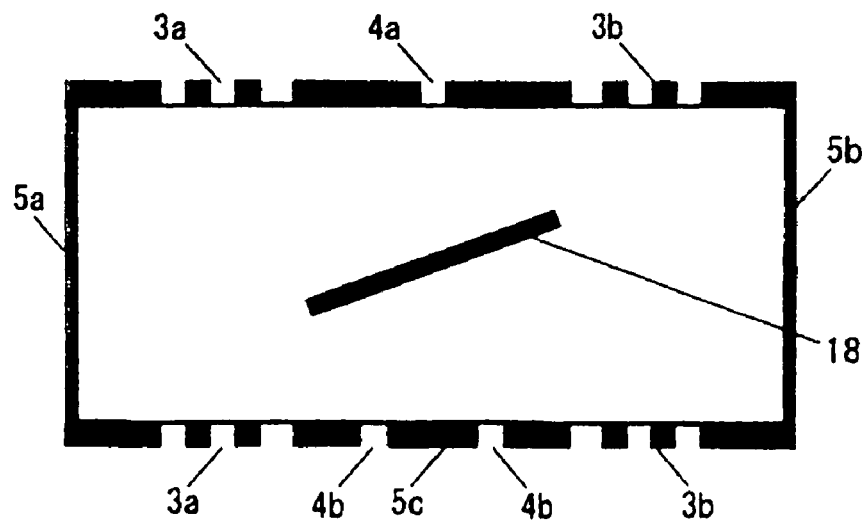
Figure 15:
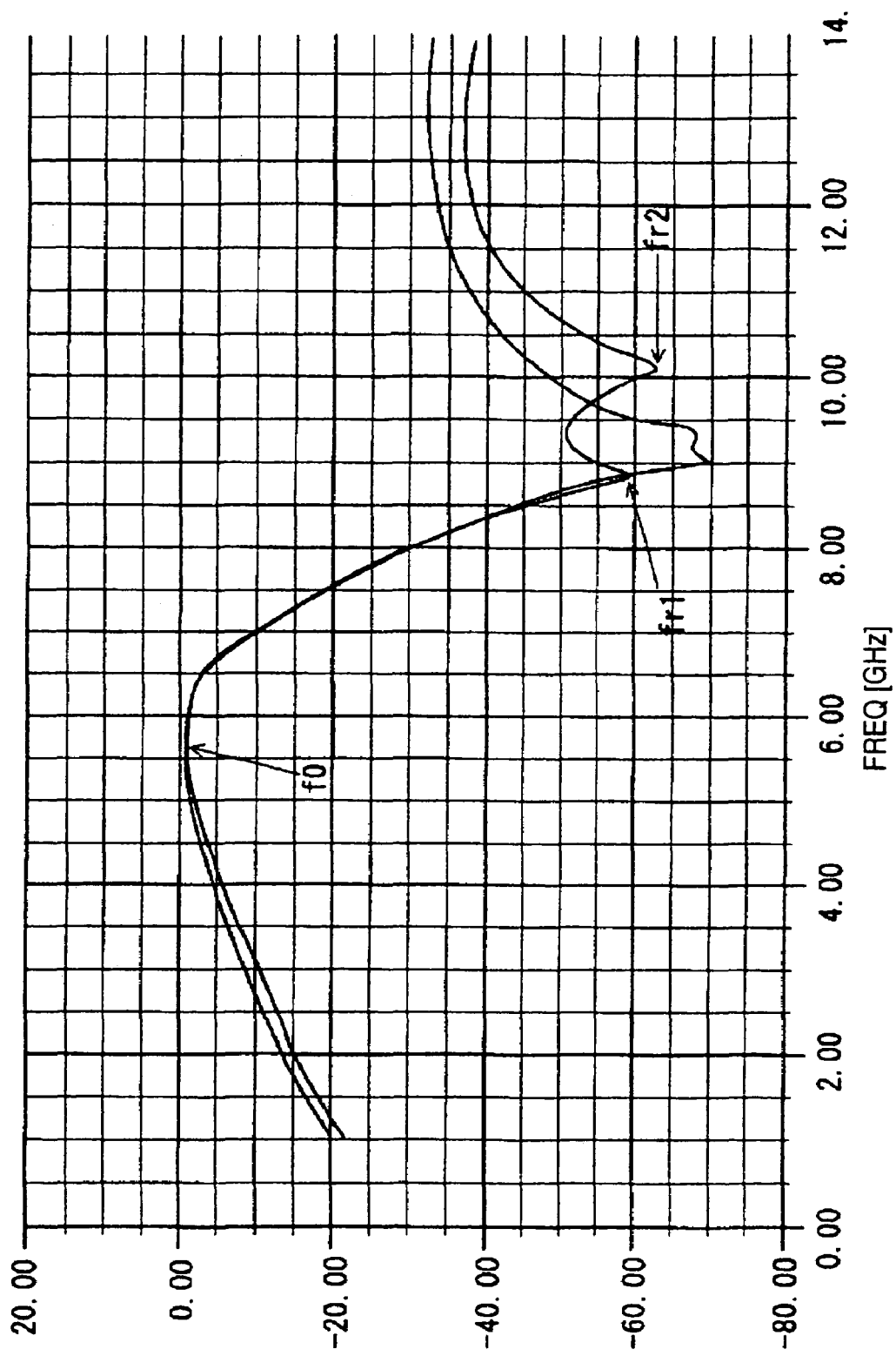

FIGS. 6 to 9 are perspective views of electronic components of Embodiment 2 of the invention, FIGS. 14A to 14C are section views of electronic components of Embodiment 2 of the invention, FIGS. 10 to 12 are equivalent circuit diagrams of electronic components of Embodiment 2 of the invention, and FIGS. 13 and 15 are views showing results of simulations conducted in Embodiment 2 of the invention.

The reference numeral 1 denotes an electronic component, 2 denotes a substrate, 3a, 3b denote spiral conductor portions, 4a denotes a first groove portion, 4b, 4c denote second groove portions, 5a denotes a first terminal portion, 5b denotes a second terminal portion, 5c denotes a third terminal portion, 7 denotes a protective film, 8, 9, 10 denote bonding films, and 18 denotes an inner layer conductor.

The reference numerals L1, L2 denote inductor components, and C1, C2, C3, C1a, C2a, C3a, Cp1, Cp2 denote capacitor components, respectively. These components will be described in detail later.

First, portions constituting the electronic component 1 will be described. However, description of the portions identical with those of Embodiment 1 will be omitted.

The spiral conductor portions 3a, 3b will be described.

Figure 6:
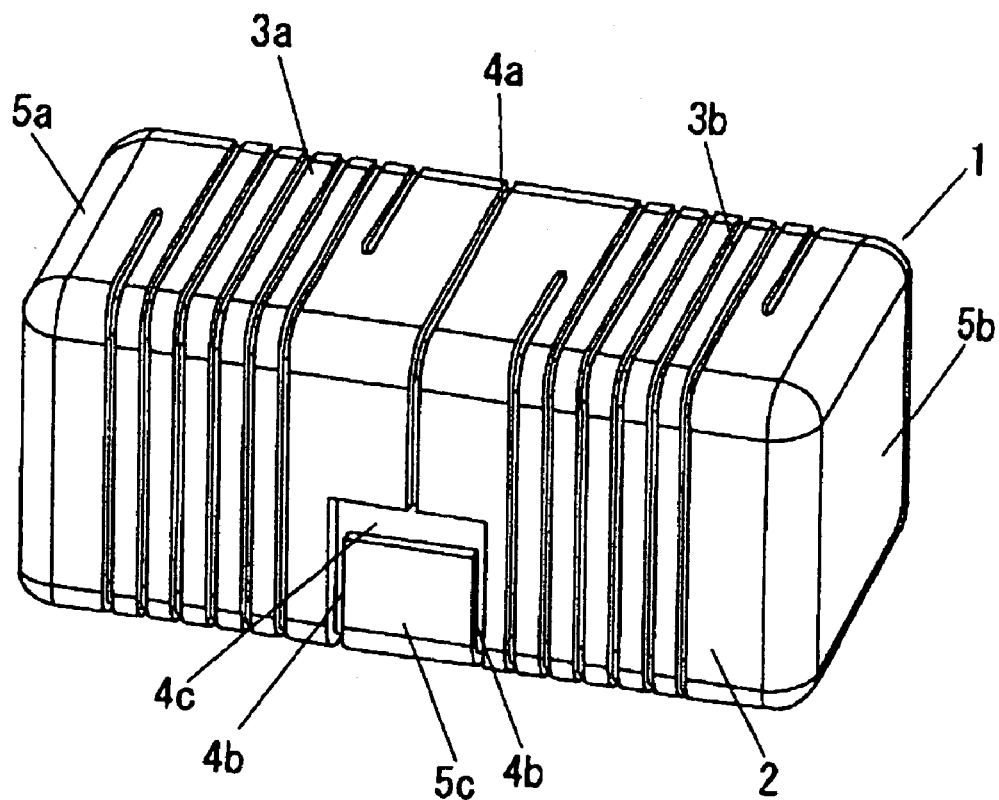
FIGS. 6 to 9 are perspective views of electronic components of Embodiment 2 of the invention.

The spiral conductor portions 3a, 3b are disposed over the whole outer periphery of the substrate to form an inductance component. For example, the inductance value can be adjusted by adjusting the number of turns, the groove width, and the groove depth in each of the spiral conductor portions 3a, 3b. One or more spiral conductor portions 3a, 3b are formed in at least one of areas between the first terminal portion 5a and the third terminal portion 5c, and between the second terminal portion 5b and the third terminal portion 5c. As shown in FIG. 6, the spiral conductor portions 3a, 3b may be disposed in the areas, respectively, or alternatively may be disposed in only one of the areas.

In order to eliminate the mounting directionality, as shown in FIG. 6, the spiral conductor portions 3a, 3b may be placed in positions of 180-degree rotation symmetry about the first groove portion 4a, respectively.

Figure 7:
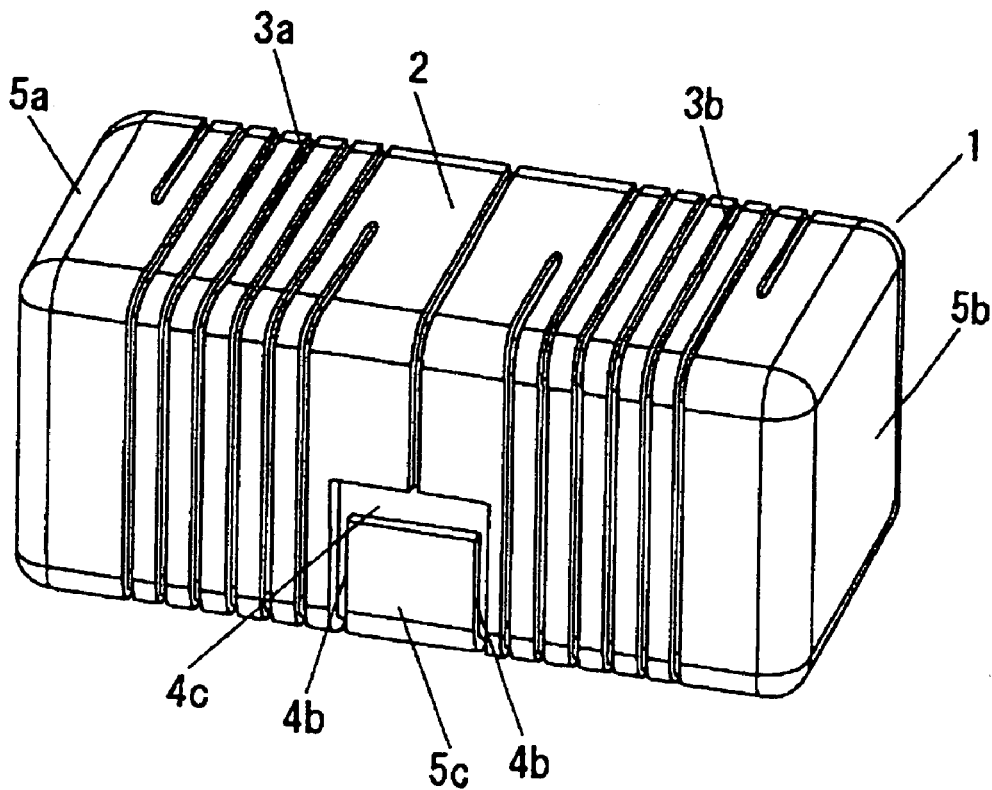

Alternatively, as shown in FIG. 7, the spiral conductor portions 3a, 3b may be placed in positions of 180-degree mirror symmetry about the first groove portion 4a, respectively. When the directionalities of the magnetic field directions of the inductance components generated respectively by the spiral conductor portions 3a, 3b are changed, the coupling force of the magnetic coupling between the inductances can be adjusted.

Alternatively, two or more spiral conductor portions 3a, 3b may be disposed between the first terminal portion 5a and the third terminal portion 5c or between the second terminal portion 5b and the third terminal portion 5c. When spiral conductor portions or inductances are placed in series, there is an advantage that the whole impedance value can be increased.

Next, the first groove portion 4a, and the second groove portions 4b, 4c will be described.

Each of the second groove portions 4b, 4c and the first groove portion 4a is formed by working a conductive film formed on the surface of the substrate 2 with a process such as laser trimming, grindstone working, ion beam machining, or photolithography. In each of the second groove portions 4b, 4c and the first groove portion 4a, a coupling capacitance is generated between opposing faces to form a capacitor component. The first and second terminal portions are set not to be electrically connected to each other by the first groove portion 4a, and the third terminal portion 5c is set not to be electrically connected to other portions by the second groove portions 4b, 4c.

The groove portions may be configured by any other means in place of the grooves, such as a notch or a cut line as far as such means can form an electrically nonconductive gap portion.

The first groove portion is connected to the second groove portions so as to be formed over the whole outer periphery of the substrate 2, whereby the first and second terminal portions are set not to be electrically connected to each other. The second groove portions completely surround the third terminal portion to set the third terminal portion to an independent state where the third terminal portion is completely nonconductive with other portions of the substrate.

Alternatively, the first groove portion may not be connected to the second groove portions.

These groove portions are formed by a groove forming technique such as trimming. When the widths and depths of the grooves are adequately changed, the capacitor value generated by the capacitance coupling due to the second groove portions 4b, 4c and the first groove portion 4a can be changed. When these values are adequately adjusted, therefore, it is possible to obtain a desired capacitance.

Next, the first and second terminal portions 5a and 5b which are paired with each other, and the third terminal portion 5c will be described.

The third terminal portion 5c is disposed between the first and second terminal portions 5a and 5b, and the first and second terminal portions are formed so as to be paired with each other on the substrate 2.

The terms "first" to "third" are used for the sake of convenience, and do not indicate a special name of a constituting portion. The terms may be used with being replaced with one another, or other terms may be used.

The first terminal portion 5a, the second terminal portion 5b, and the third terminal portion 5c are made of a conductive material. In the case where a conductive film is formed on the surface of the substrate 2, for example, the first terminal portion 5a, the second terminal portion 5b, and the third terminal portion 5c can be realized by forming the conductive film, also on the surfaces corresponding to the terminal portions. Specifically, a conductive film is formed so as to cover the whole surface of the substrate 2, and first gap portions 4b, 4c, and a second gap portion 4a are formed in the conductive film, whereby the first terminal portion 5a, the second terminal portion 5b, and the third terminal portion 5c are formed.

Alternatively, conductive films of a larger number of layers may be formed in order to adjust the conductance performance or the strength. The first terminal portion 5a and the second terminal portion 5b are terminal portions which are disposed on the substrate 2, and usually formed on the both ends, respectively. In the case where a projection exists in the ends, for example, the terminal portions may be formed on portions other the ends. The terminal portions may be formed in middle positions of the substrate 2. The positions may be symmetrically located, or asymmetrically located.

The first and second terminal portions 5a and 5b are to be mounted on a circuit board. Therefore, it is preferable to form a structure such as a plating layer structure which has a high affinity to a mounting land.

In the first and second terminal portions 5a and 5b, the conductive film may be formed on the end and side faces of the substrate 2. Alternatively, the conductive film may not be formed on the end faces of the substrate 2, and may be formed only on the side faces, or only on a part of the side faces.

The third terminal portion 5c is formed by the second groove portions 4b, 4c. In the surface, similarly, a conductive film is formed into a single or multi layer structure. Since the third terminal portion is to be connected to a ground plane of the circuit board, it is preferable to form a structure such as a plating layer structure which has a high affinity to a mounting land.

The third terminal portion 5c is disposed between the paired first and second terminal portions 5a and 5b, and in a substantially middle of the substrate 2. This configuration is preferable because a bilaterally symmetrical electronic component can be configured.

FIG. 9 shows the case where a part of the substrate 2 is stepped down. Because of the stepped down portion, the spiral conductor portions 3a, 3b are not in direct contact with the circuit board, and hence the inductor component and the like are not adversely affected. When the protective film 7 which will be described later is formed in the stepped down portion, the level of the protective film 7 is constant, and hence there is an advantage that the mounting property is excellent. Since the stepped down portion is disposed, the protective film 7 can be made thicker, and hence there is a further advantage that the durability can be enhanced.

In the case where, as shown in FIG. 4, the substrate 2 is stepped down in the portion other than the terminal portions 5a, 5b and the third terminal portion 5c, preferably, the third terminal portion 5c is not stepped down, or remains unprocessed in order to ensure the grounding connection.

Preferably, the levels (the levels in the side of the mounting surface) of the third terminal portion 5c, the first terminal portion 5a, and the second terminal portion 5b are made equal to one another, so that the electronic component can be mounted surely and easily on a circuit board.

Next, the case where the protective film and the like are formed will be described with reference to FIG. 8.

The reference numeral 7 denotes the protective film, and 8, 9, 10 denote bonding films. The protective film 7 is disposed so as to cover at least the spiral conductor portions 3a, 3b, the first groove portion 4a, and the second groove portions 4b, 4c. Of course, the protective film may be disposed on the whole periphery of the substrate 2 excluding the first, second, and third terminal portions 5a, 5b, and 5c. The protective film 7 is made of an insulative material. A resin or ceramic is preferably used as the material. Specific examples are a resin material such as an epoxy resin, and an insulating film of silicon oxide or the like.

The protective film 7 is formed by any one of various methods including application, electrodeposition, and electrostatic coating. Alternatively, the protective film may be formed by using a tubular protective film. The tubular protective film can be realized by attaching the protective film 7 having a tubular shape to the periphery of the substrate 2, and then applying heat to cause the film to be in close contact with the substrate. The tubular protective film is formed so as to cover the spiral conductor portions 3a, 3b, the first gap portions 4b, 4c, and the first and second groove portions, and hence the protective film 7 does not flows into grooves such as the spiral conductor portions 3a, 3b. Therefore, the inductor characteristics are not varied by the disposition of the tubular protective film. Preferably, a material which is made of a resin and heat-shrinkable is selected as the material of the tubular protective film because of the following reason. When the substrate 2 is covered by such a tubular protective film and a heat treatment is applied to the film, the tubular film shrinks so that the tubular protective film can be surely formed on the substrate 2.

As the coating composition, preferably, one of an electrodepositable coating composition, a transfer coating composition, glass, and low-temperature fired ceramics is used, or a combination of these materials is used.

Since the protective film 7 is disposed, the conductive film of the substrate 2, the spiral conductor portions 3a, 3b, the grooves of the first and second groove portions, and the like can be prevented from being damaged. Particularly, they can be protected from shocks and heat during transportation and a mounting process.

The bonding films 8, 9, 10 are configured by so-called lead-free solder in which only Sn is used or elements other than lead are added to Sn. In the embodiment, the bonding films are disposed in order to improve the bonding property in, for example, a process of mounting the electronic component onto a circuit board. In the case where the bonding property is sufficiently attained by the first terminal portion 5a, the second terminals portion 5b, and the third terminal portion 5c, it is not necessary to dispose the bonding films 8, 9, 10. More preferably, a film of nickel or a nickel alloy may be disposed between the first terminal portion 5a, the second terminals portion 5b, and the third terminal portion 5c, and the bonding films 8, 9, 10 in order to prevent solder leaching from occurring, and improve, for example, the weather resistance of the terminal portions 5a, 5b and the third terminal portion 5c.

Next, the inner layer conductor 18 will be described.

The inner layer conductor 18 enables the position of a pole generated in an attenuation curve showing filter characteristics, to be easily adjusted without affecting the cutoff frequency. Therefore, the performance can be improved. This was found by the inventor as a result of various experiments, etc.

The inner layer conductor 18 has a function of attenuating magnetic fluxes generated by the spiral conductor portions 3a, 3b, whereby the condition of forming the pole position can be changed as described later.

The inner layer conductor 18 is formed inside the substrate 2, and not electrically connected to other portions such as the conductive film formed on the surface of the substrate 2, or is an independent conductor. In order to attenuate magnetic fluxes in a balanced manner, preferably, the inner layer conductor 18 is placed substantially in the middle of the substrate 2 as shown in FIGS. 14A to 14C. However, the inner layer conductor may be placed in a position other than the middle, and shifted in either of the lengthwise direction or the widthwise direction of the substrate 2. Although the inner layer conductor is preferably placed so as to be approximately parallel to one of the faces of the substrate 2 in order to attenuate magnetic fluxes in a balanced manner, the inner layer conductor may be inclined.

Alternatively, the inner layer conductor may not be placed in the middle of the substrate 2, and may be placed in a shifted position, or may be shifted in the lengthwise direction or in the widthwise direction.

Since the inner layer conductor is used for attenuating magnetic fluxes, it is preferably placed in a position opposed to the spiral conductor portions 3a, 3b. However, the inner layer conductor may be placed with being slightly shifted from the position. It may be preferable to adjust the degree of attenuation of magnetic fluxes by placing the inner layer conductor with being slightly shifted. Even in the case where plural spiral conductor portions 3a, 3b are used, the inner layer conductor 18 may be formed by a single member such as a plate, paste, a printed face, or a pattern. Alternatively, the inner layer conductor may be formed in a number which is equal to or different from that of the spiral conductor portions 3a, 3b.

The area of the inner layer conductor is adequately determined so as to attenuate magnetic fluxes generated by the spiral conductor portions 3a, 3b. As the area is larger, the magnetic fluxes are attenuated by a larger degree. By contrast, when the attenuation amount is to be reduced, the area may be reduced. The attenuation amount can be adjusted by the thickness or material of the inner layer conductor.

Alternatively, the inner layer conductor 18 may not be formed as a single member, but as plural members, and may be formed by a prism-like member in place of a plate-like member.

These alternatives are shown in, for example, FIG. 14B and 14C.

The electronic component may be formed by inserting the inner layer conductor 18 into the substrate 2 and then firing the substrate, or by stacking two separate laminations.

The material of the inner layer conductor 18 may be a metal such as gold, silver, copper, platinum, or palladium, or an alloy of such metals.

The inner layer conductor 18 can be realized by printing in a laminated member a platinum or tungsten electrode in which diffusion hardly advances at the firing temperature of the substrate material. In the case where a low-temperature fired material such as glass ceramics is used as the material of the substrate 2, a silver electrode or a copper electrode may be used.

The basic configuration and constituents of the electronic component of the invention have been described in detail.

It is a matter of course that other constituents can be added.

Next, the operation and function of the thus configured electronic component will be described with reference to the equivalent circuit diagrams, etc.

The inductor component is generated by the spiral conductor portions 3a, 3b, and the capacitor component due to the first and second groove portions and the like (i.e., the capacitor component generated between the opposing faces of the first terminal portion 5a and the second terminal portion 5b, or that produced between the third terminal portion 5c and the other surrounding portions of the substrate) are generated. The resonance condition based on the inductor component (L) and the capacitor component (C) is generated. The operation as a filter is realized by the resonance condition.

FIGS. 10, 11, and 12 show equivalent circuits of electronic components according to the invention. In the figures, inductor and capacitor components produced by various portions are indicated.

FIG. 10 shows an equivalent circuit of the electronic component 1 shown in FIG. 6, etc.

The equivalent circuit is a band-pass filter in which the inductor value of the spiral conductor portion 3a is L1, that of the spiral conductor portion 3b is L2, the coupling capacitors in the second groove portions 4b, 4c between the paired first and second terminal portions 5a and 5b, and the third terminal portion 5c are C1 and C2, respectively, and the coupling capacitor in the first groove portion 4a between the two terminal portions 5a and 5b is C3.

In FIG. 10, C1, C2, C3 constitute a π-circuit. When the circuit is converted to an equivalent T-circuit, the equivalent circuit shown in FIG. 11 is obtained.

When the capacitances after the conversion are C1a, C2a, C3a, respectively, L1 and C1a constitute a series resonance circuit, the impedance Z is indicated by (Exp. 1), and the resonance frequency f0 is calculated by (Exp. 2) showing the resonance condition. As seen from (Exp. 1) and (Exp. 2), the impedance is minimum at the resonance frequency f0, the impedance with respect to a signal in this band is low, and that with respect to a signal in the other band is high. In other words, it will be seen that a circuit element functioning as a band-pass filter in which the signal attenuation in a frequency band other then that satisfying the resonance condition is very large, and through which only a signal in a specific frequency band (i.e., specific band) can be passed is configured.

Also L2 and C2a similarly operate. When the degree of coupling is adjusted by the grounding capacitance C3a of the two resonance circuits, it is possible to adjust the width of the pass band of the band-pass filter.

$$Z = R + j\left(\omega L - \frac{1}{\omega C}\right) \qquad \text{[Exp. 1]}$$

$$f_0 = \frac{1}{2\pi\sqrt{LC}} \qquad \text{[Exp. 2]}$$

When the electronic component 1 is mounted in a signal line, a signal is input to one of the first and second terminal portions 5a and 5b, and a signal is output from the other one of the terminal portions, the circuit functions as a band-pass filter through which only a signal in a specific frequency band can be passed.

When the third terminal portion 5c is grounded, a signal other than the pass band can be surely eliminated.

The spiral conductor portions 3a, 3b have an inductance component, and electric field coupling occurs between spiral lines. As shown in FIG. 12, capacitances Cp1, Cp2 which are connected in parallel to the inductances in the equivalent circuit are generated as parasitic capacitances. An input signal is divided into a signal which passes through the capacitance Cp1, and that which passes through the inductance L1. In the two paths, the phase in the inductance portion is changed by 90 deg., and that in the capacitance portion is changed by −90 deg. The signals which are to be again combined with each other are anti-phase signals which are different in phase by 180 deg., and are 0 in level at the resonance frequency fr1 of the parallel resonance circuit of Cp1 and L1. The resonance frequency fr1 is calculated by (Exp. 1) showing the resonance condition. Similarly, signals which pass Cp2 and the inductance L2, respectively are 0 in level at the resonance frequency fr2 of the parallel resonance circuit of Cp2 and L2 (also the resonance frequency fr2 is calculated by (Exp. 1)). As a result, the filter characteristics are attenuation characteristics having poles at frequencies fr1 and fr2. Because of the formation of the poles, it is possible to adjust the attenuation curve which is important as the filter characteristics. For example, the electronic component is configured as a filter having a more intense attenuation curve or a less intense attenuation curve.

Next, experimental results will be described that show a phenomenon in which the pole generation can be adjusted and the filter performance is improved by enabling the electronic component 1 of the invention to operate as a band-pass filter and further disposing the inner layer conductor 18.

FIG. 13 shows results of experiments which were conducted with using the electronic component 1 as a band-pass filter, and under the conditions indicated in FIG. 12 showing the equivalent circuit. As seen from FIG. 13, the electronic component operates as a band-pass filter through which a signal in the vicinity of 6 GHz can be band-passed. At a frequency other than the band, attenuation of about 0 dB or more occurs, and hence the electronic component has enough performance to operate as a band-pass filter.

The inductance values L1, L2 and the capacitor values C1, C2, C3 can be adjusted. When the electronic component is used as a band-pass filter, therefore, the pass band frequency can be changed.

It will be seen that poles are generated at 9 GHz and 11 GHz.

Since Cp1, Cp2 are parasitic capacitances, they are hardly changed. When the inner layer conductor 18 is formed inside the substrate as shown in FIG. 14 to block the magnetic field generated by the spiral conductor portions 3a, 3b, the frequencies fr1, fr2 where a pole is generated can be easily changed simply by minutely changing the inductance values L1, L2 without requiring the capacitor components Cp1, Cp2 (the both components are cumbersomely adjusted) which are parallel to the inductance values.

At this time, Cp1, Cp2 are very smaller than the capacitor values C1, C2, and hence f0 is not affected by minute changes of the inductance values L1, L2. FIG. 15 shows results of experiments in which the length PL of the inner layer conductor was changed. As seen from FIG. 15, the pole positions fr1 and fr2 can be largely changed without changing the pass band frequency f0, so that the attenuation characteristics can be improved.

As seen from the experimental results, according to the composite LC filter according to the invention, a high-performance band-pass filter is realized to which also the function of controlling the frequency where a pole is generated can be added.

In the conventional art, the minimum size of an electronic component is 1608 size of a multilayer LC filter. By contrast, according to the embodiment of the invention, in 1005 size or 0603 size, it is possible to attain an inductance of 1 to 56 nH in the spiral conductor portions. In the case where ceramics having a specific dielectric constant of 1 to 150 is used as the material of the substrate, when the gap portion has a width of 0.01 to 0.1 mm, it is possible to attain a capacitance of 0.1 to 10 pF. Therefore, an electronic component of an ultra small size or 0603 size can be realized, so that a filter can be configured by a component which is very smaller than a conventional multilayer LC filter.

Hereinafter, mounting of the electronic component will be described.

Figure 16:
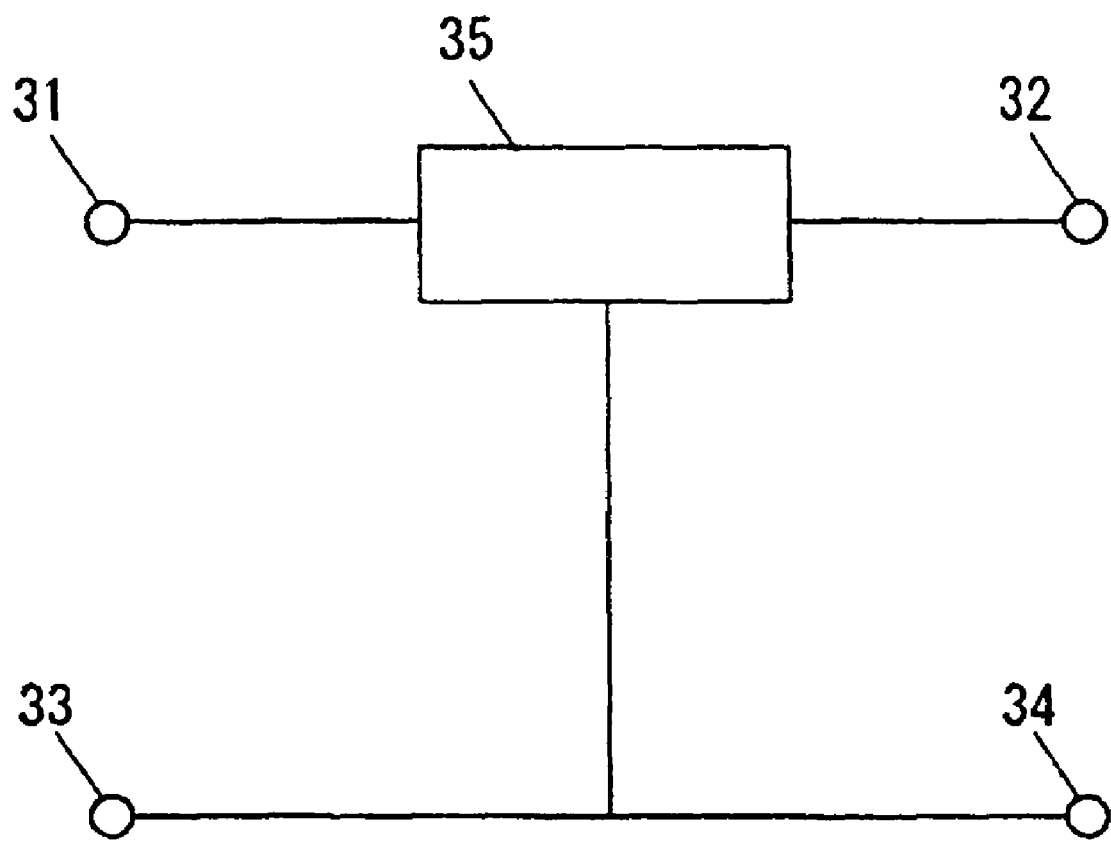
FIG. 16 is a diagram showing a part of an electronic circuit in Embodiment of the invention.

FIG. 16 is a diagram showing a part of an electronic circuit in Embodiment 3 of the invention. The figure shows a part of an electronic circuit of one of various electronic apparatuses such as a wireless terminal. The reference numerals 31, 32 denote signal lines, 33, 34 denote ground lines, and 35 denotes the electronic component of Embodiment 1 or 2. Referring to FIG. 16, the first and second terminal portions 5a and 5b of the electronic component 35 are connected to the signal lines 31, 32, respectively to constitute a circuit which applies a filtering process having the pass band center frequency at the resonance frequency of the electronic component of the invention, on a signal incoming from the line 31, and which then outputs the resulting signal to the line 32. The third terminal portion 5c is connected to the ground lines 33, 34 to short-circuit an unwanted signal to the ground.

When such a circuit is incorporated, the electronic component can be used as a band-pass filter for eliminating noises or selecting the frequency of a received signal. In this case, the electronic component 35 can be configured as an element member of an ultra small size, and hence also the electronic circuit can be miniaturized. As a result, the size of the electronic apparatus into which the electronic circuit is incorporated can be reduced. Since the electronic component is produced with a high yield and at a low cost, cost reduction of the electronic apparatus can be realized, and an operation failure after mounting, and the like can be reduced, so that the reliability of the electronic apparatus can be enhanced.

As described above, the electronic component can be optimally used in an electronic apparatus in which a band-pass filter is required.

Unlike a laminated electronic component in which an indictor is configured inside a laminated portion and the laminated portion is used as a capacitor component, the capacitor and inductor values can be determined by a trimming process as described above, and hence the values can be easily adjusted. Particularly, the capacitor and inductor values can be simultaneously determined by a trimming step, and an indictor and a capacitor can be formed by the same process. As compared with a laminated electronic component in which an indictor is formed by transferring or printing, and complex steps such as lamination are then required, therefore, the steps can be very simplified. The simplified steps can suppress dispersion and realize a reduced cost.

Since a trimming process which is accurate means is used, a highly accurate component can be realized, and dispersion of the capacitor and inductor values which is inevitably caused in the case of lamination can be reduced, with the result that the yield is high and cost reduction can be easily realized. Since the coupling capacitors in the second gap portion 4a and the first gap portions 4b, 4c can be used as the capacitor component, there is an advantage that determination and fine adjustment of the capacitor component can be easily conducted. As seen from the experimental results, the electronic component achieves performance which is higher than enough. Moreover, the disposition of the inner layer conductor 18 enables the pole position to be easily changed without changing the pass band frequency, and hence the filter characteristics such as attenuation characteristics can be sufficiently improved.

In a conventional electronic component having an inductor and a capacitance, a laminated structure is employed in order to put emphasis on ensuring of the capacitor component, and therefore the number of production steps is large, the cost is high, and the accuracy is dispersed by a firing process or the like. By contrast, it is possible to realize an electronic component which has an inductor and a capacitance, and in which the production steps can be simplified and an accurate inductor component can be sufficiently ensured.

(Embodiment 3)

Unlike the band-pass filters of Embodiments 1, 2, a low-pass filter is formed in Embodiment 3.

Figure 19:
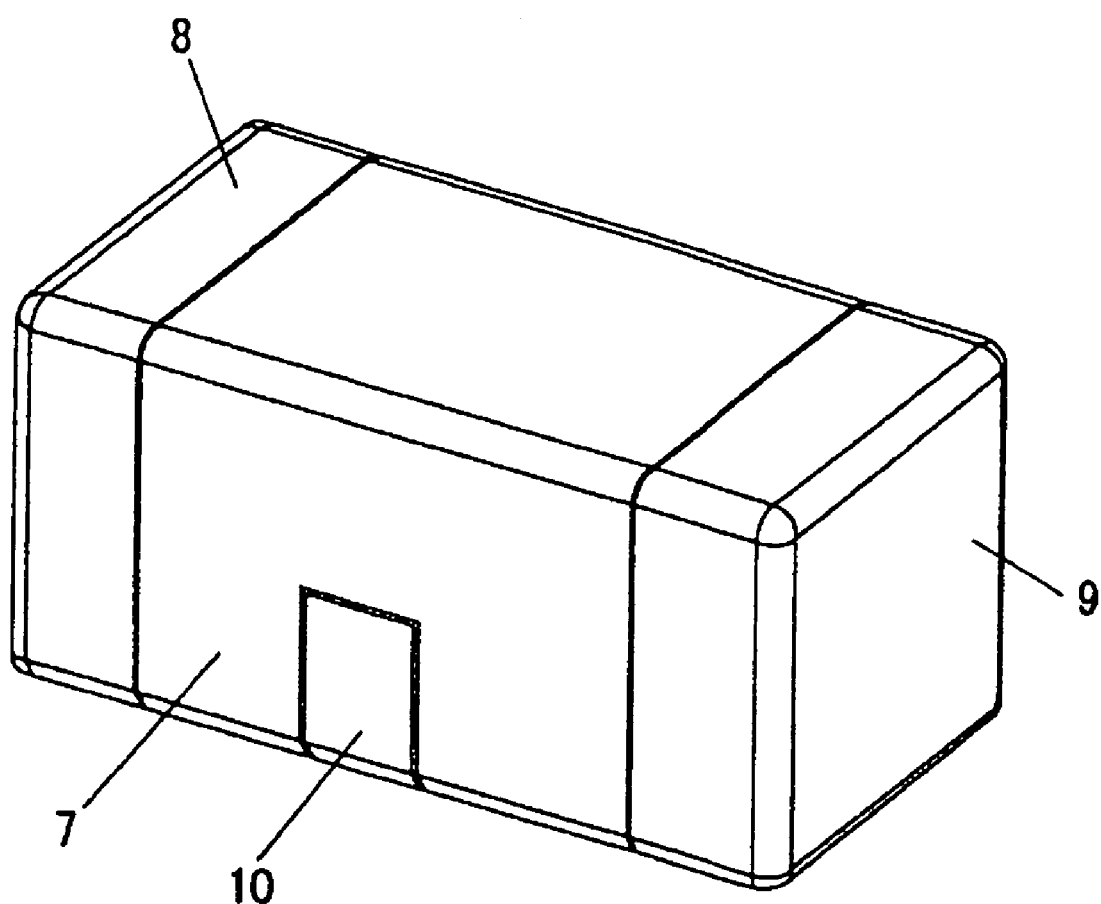
Figure 20:
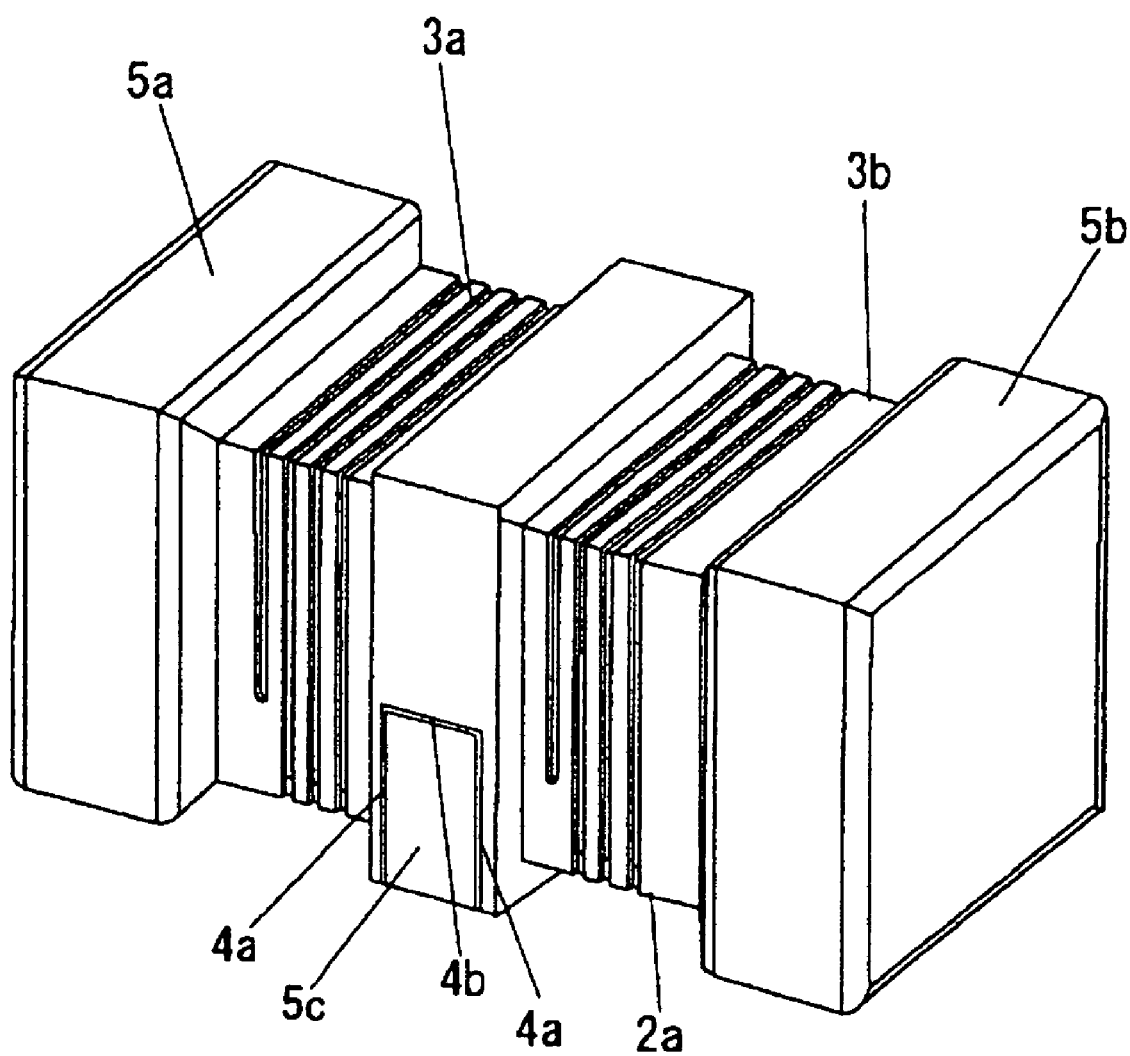
Figure 21:
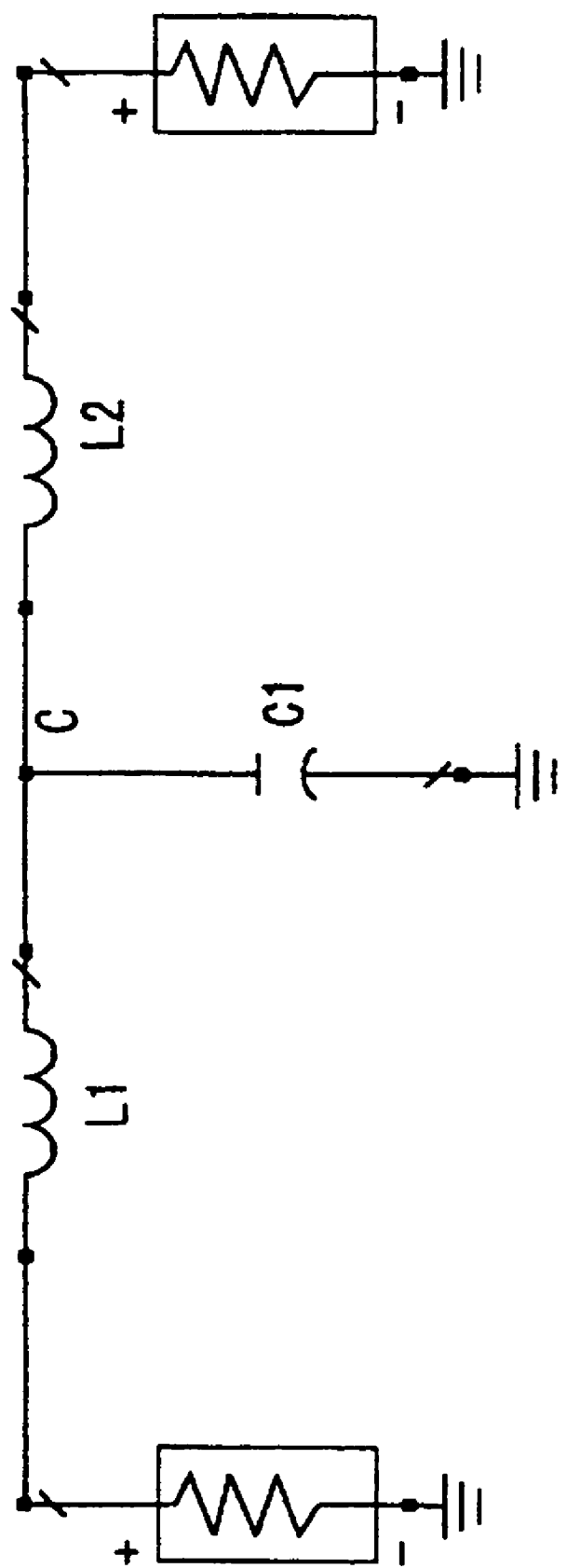
FIGS. 21 and 22 are equivalent circuit diagrams of electronic components of Embodiment 3 of the invention.
Figure 22:
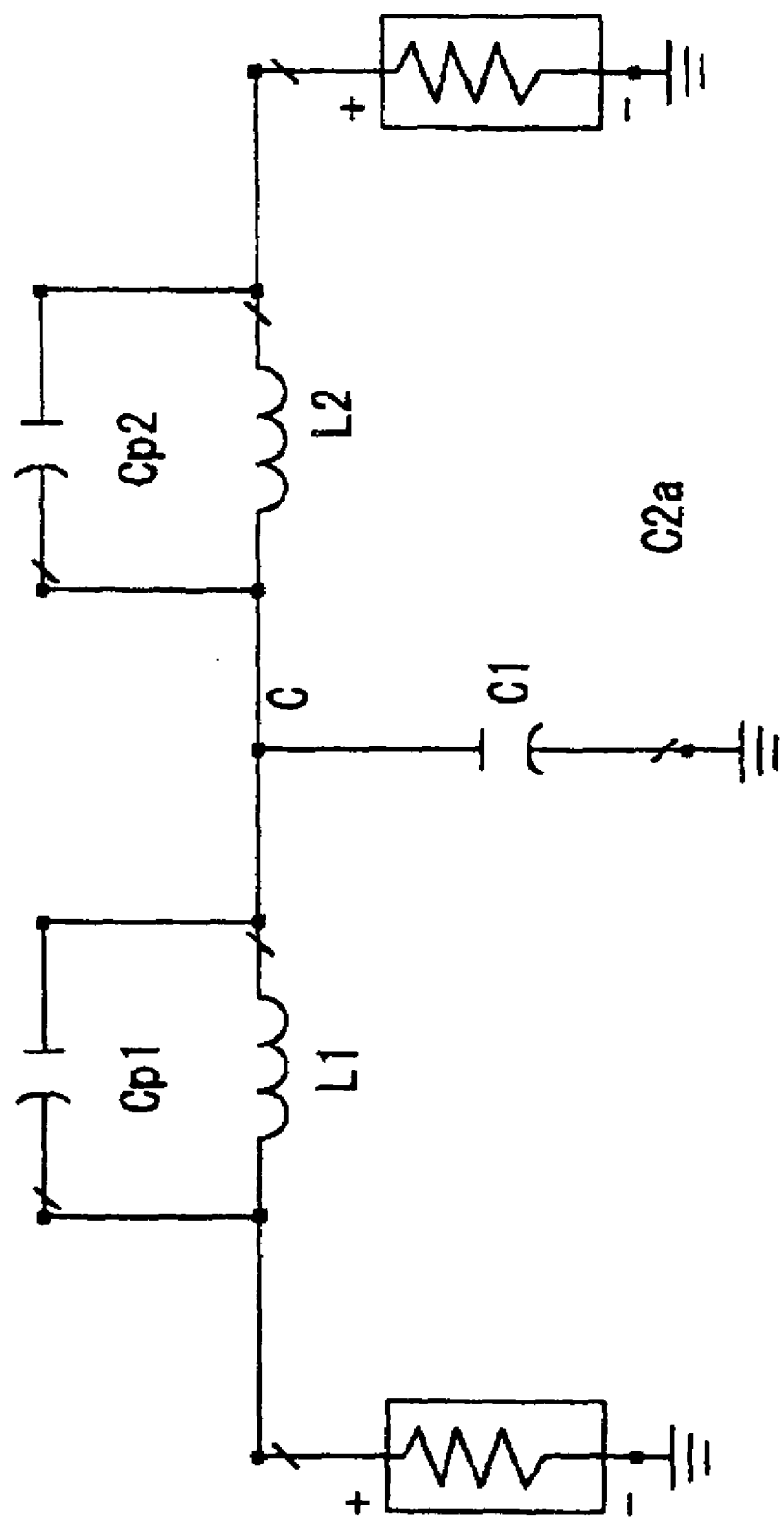
Figure 23:
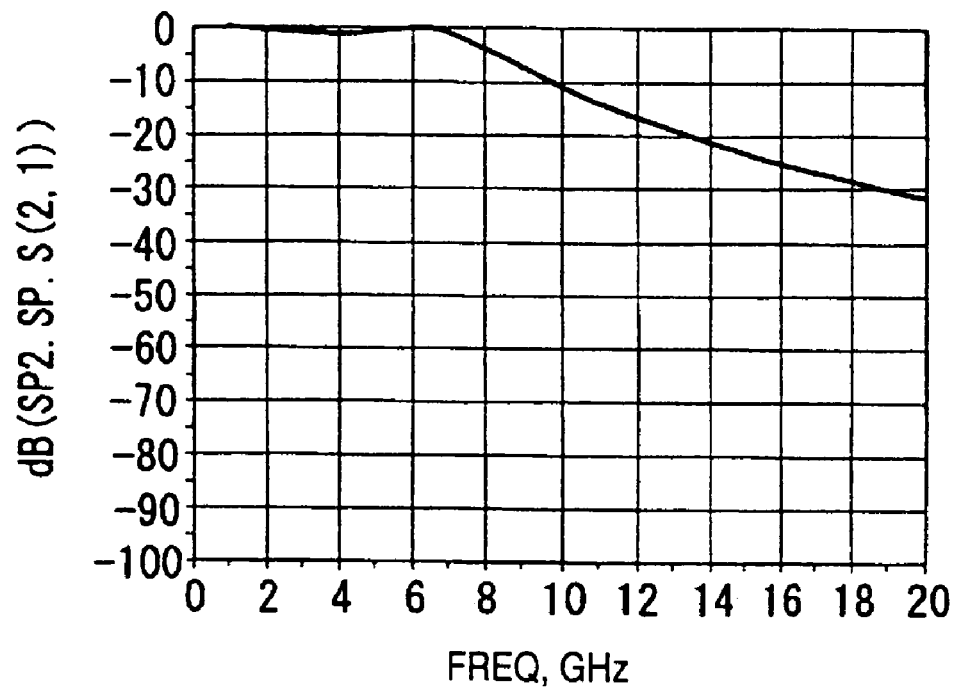
FIGS. 23 and 24 are views showing results of simulations conducted in Embodiment 3 of the invention
Figure 24:
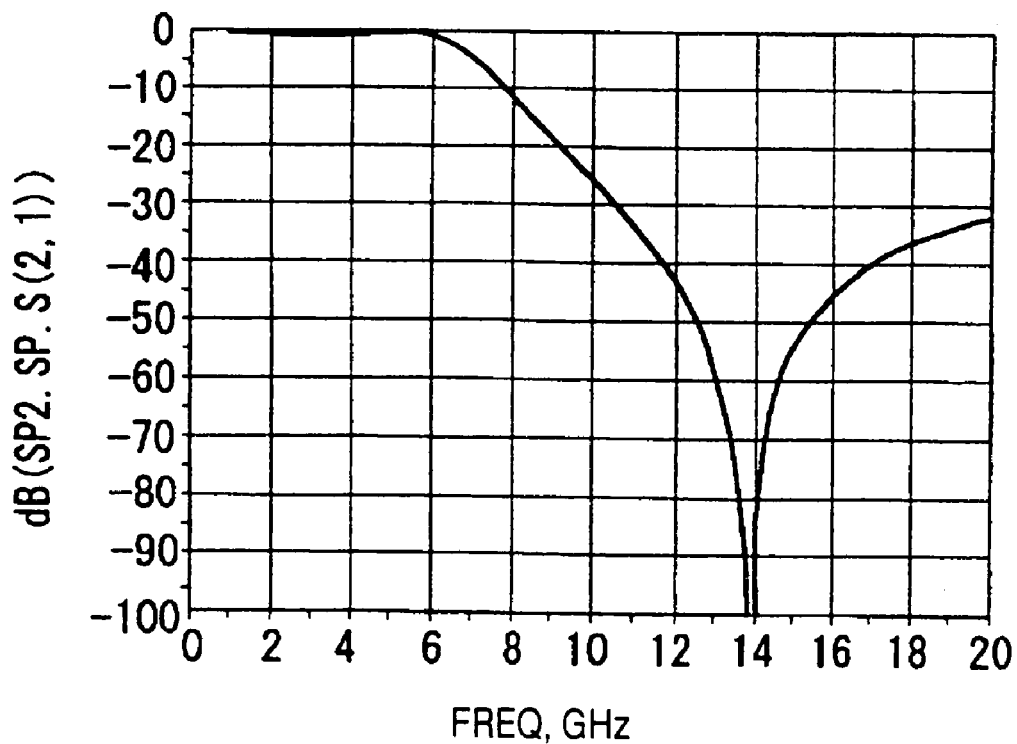
Figure 25A:
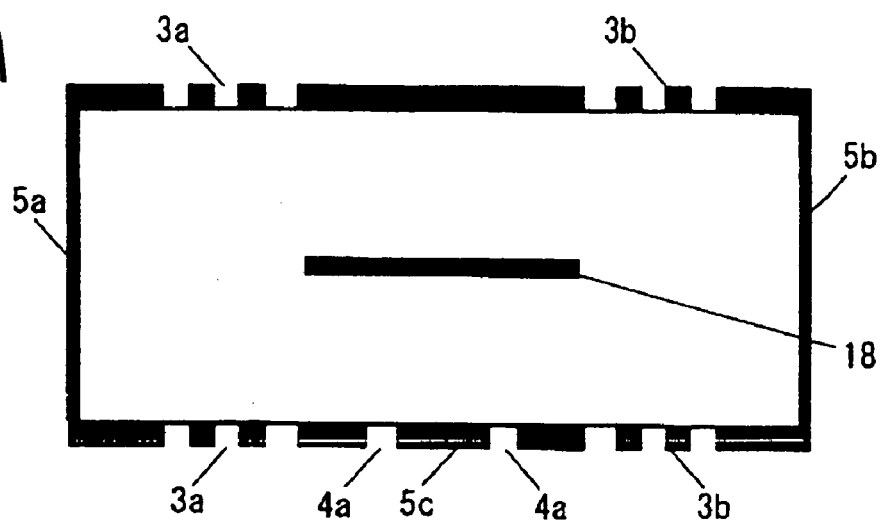
Figure 25B:
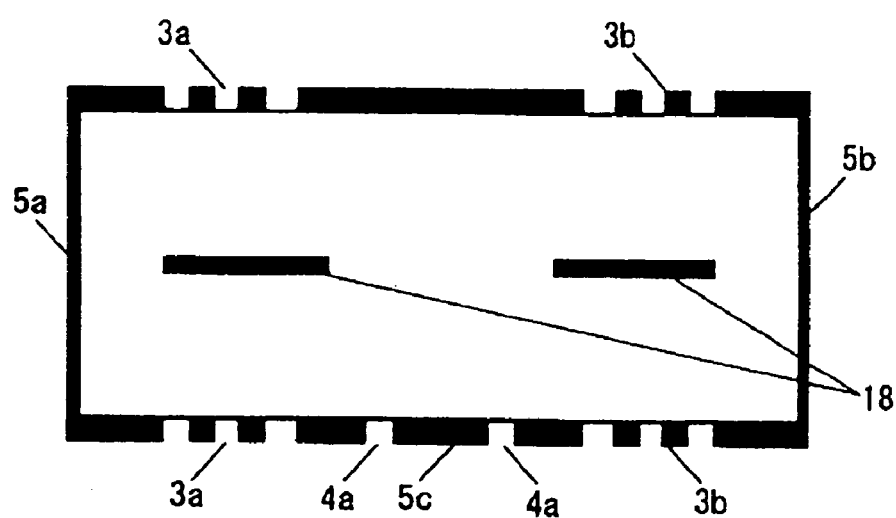
Figure 25C:
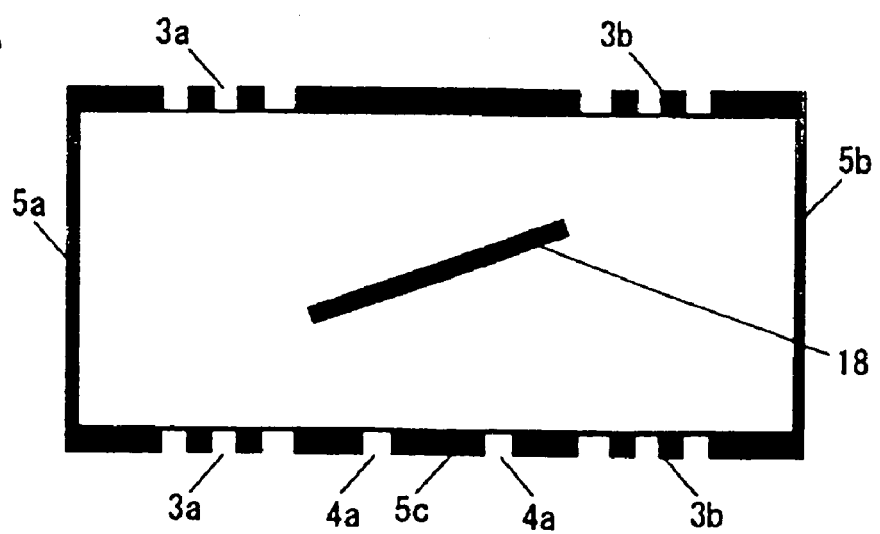

FIGS. 17 to 20 are perspective views of electronic components of Embodiment 3 of the invention, FIGS. 25A to 25C are section views of electronic components of Embodiment 3 of the invention, FIGS. 21 and 22 are equivalent circuit diagrams of electronic components of Embodiment 3 of the invention, and FIGS. 23 and 24 are views showing results of simulations conducted in Embodiment 3 of the invention.

The reference numeral 1 denotes an electronic component, 2 denotes a substrate, 3a, 3b denote spiral conductor portions, 4a, 4b denote second groove portions, 5a, 5b denote first and second terminal portions, 5c denotes a third terminal portion, 7 denotes a protective film, 8, 9, 10 denote bonding films, and 18 denotes an inner layer conductor.

The reference numerals L1, L2 denote inductor components, and C1, C2, C3 denote capacitor components, respectively.

First, portions constituting the electronic component 1 will be described in detail.

The substrate 2 will be described.

The substrate 2 is made of an insulative material. As the material of the substrate 2, preferably useful are materials such as barium titanate, alumina, an alumina-based material, forsterite, magnetic ferrite, and silicon oxide. When a dielectric material essentially comprising barium titanate having a large specific dielectric constant is used, particularly, a large capacitance can be obtained. When alumina or an alumina-based material is used, it is possible to obtain an electronic component which is useful for high frequency applications, and which has high strength and excellent workability.

One or more layers of a conductive film made of a conductive material such as copper, silver, gold, or nickel, or an alloy of such metals are laminated on the whole periphery of the substrate 2 to form a conductive film. The conductive film is formed by a method such as plating, vapor deposition, sputtering, pasting, CVD, or printing. Preferably, ceramics useful as the material of the substrate has a specific dielectric constant of about 1 to 150.

The conductive film which is formed on a substantially whole face of the substrate 2 is trimmed by laser, grinding stone, or the like to be formed into the spiral conductor portions 3a, 3b and the second groove portions 4a, 4b. Alternatively, a resist pattern may be formed on the conductive film formed on a substantially whole face, by the photolithography technique, and the conductor portions and groove portions may be then formed by the etching technique or the like.

The conductive film may be formed on the faces excluding the end face constituting end portions, as described later.

Figure 17:
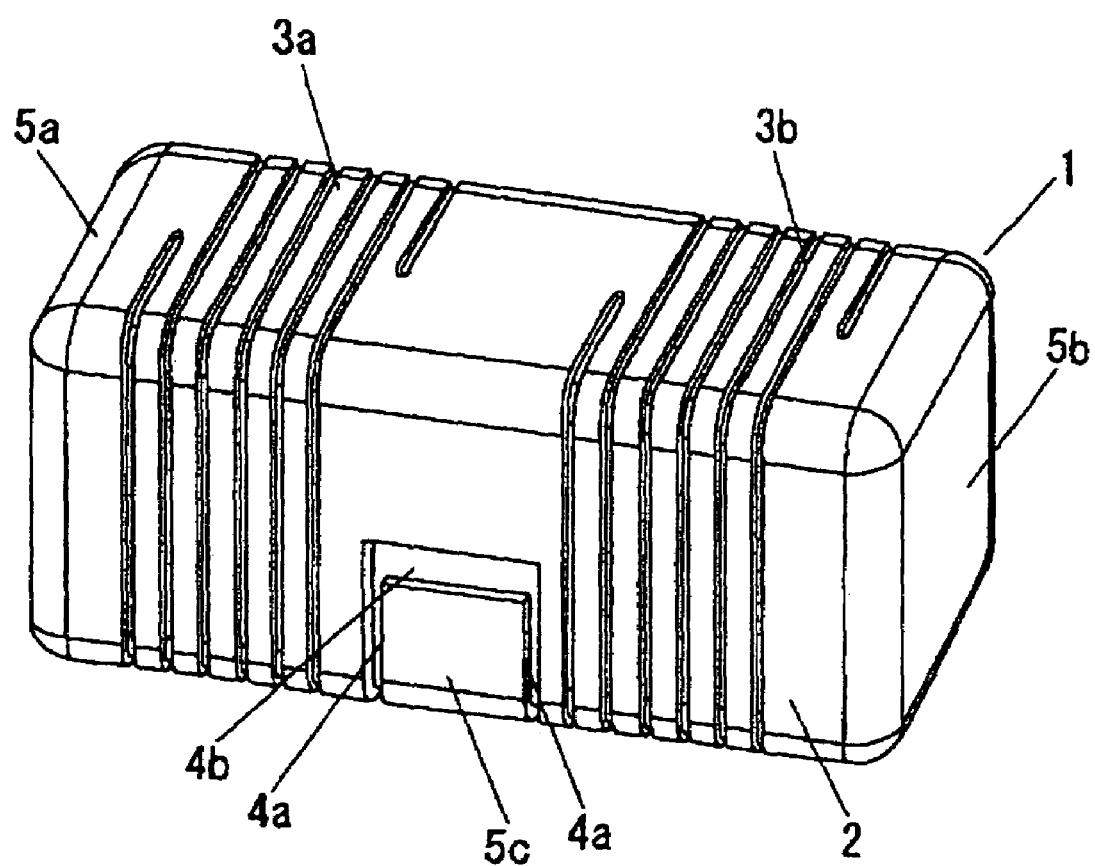
FIGS. 17 to 20 are perspective views of electronic components of Embodiment 3 of the invention.

In FIG. 17, the substrate 2 is formed as a rectangular prism. Alternatively, the substrate may be formed as a triangular prism, a column, or a polygonal prism having five or more edges.

The pair of first and second terminal portions are disposed on the substrate 2, and usually formed on the both ends of the substrate 2, respectively. Alternatively, the terminal portions may not be disposed on the ends, and may be formed in middle positions of the substrate 2. In consideration of easiness of mounting, the first and second terminal portions may be disposed on the whole side face of an arbitrary portion of the substrate 2, or only on a face which is used as a mounting surface.

The third terminal portion is disposed on the substrate 2, and between the first and second terminal portions. When the third terminal portion is placed in a substantially middle between the first and second terminal portions, a bilaterally symmetrical electronic component can be configured, and the mounting directionality can be eliminated.

The third terminal portion may be disposed only on a face of the substrate 2 which is used as a mounting surface, or may be formed so as to extend also to at least a part of a face which is unparallel to the mounting surface. When the third terminal portion is formed so as to extend also to a part of an unparallel face, there is an advantage that the mounting strength is enhanced. However, the third terminal portion cannot be formed over the whole side face of the substrate 2 because the third terminal portion must be electrically insulated or independent from the periphery by the second groove portion.

The first and second terminal portions 5a and 5b are to be mounted on a circuit board. Therefore, it is preferable to form a structure such as a plating layer structure which has a high affinity to a mounting land.

Next, the spiral conductor portions 3a, 3b will be described.

The spiral conductor portions 3a, 3b are disposed over the whole outer periphery of the substrate to form an inductance component. For example, the inductance value can be adjusted by adjusting the spiral conductor portions. The spiral conductor portions 3a, 3b are formed in areas between the third terminal portion 5c, and the first and second terminal portions 5a and 5b. As shown in FIG. 1, the spiral conductor portions 3a, 3b may be disposed in the areas between the third terminal portion 5c, and the first and second terminal portions 5a and 5b, respectively, or alternatively may be disposed in only one of the areas between the first and second terminal portions 5a and 5b, and the third terminal portion 5c.

In the case where the spiral conductor portions 3a, 3b are disposed in both the areas between the first and second terminal portions 5a and 5b, and the third terminal portion 5c, the spiral conductor portions are formed so as to be symmetrical about the third terminal portion 5c, thereby forming a circuit which is symmetrical about the third terminal portion 5c. Consequently, it is possible to eliminate the mounting directionality of the electronic component 1. Since the mounting directionality is eliminated, the electronic component can function as a filter which will be described later, and which exhibits the same characteristics irrespective of the mounting direction. Therefore, a failure in mounting the electronic component can be eliminated, with the result that the yield can be improved and the cost can be lowered.

Figure 18:
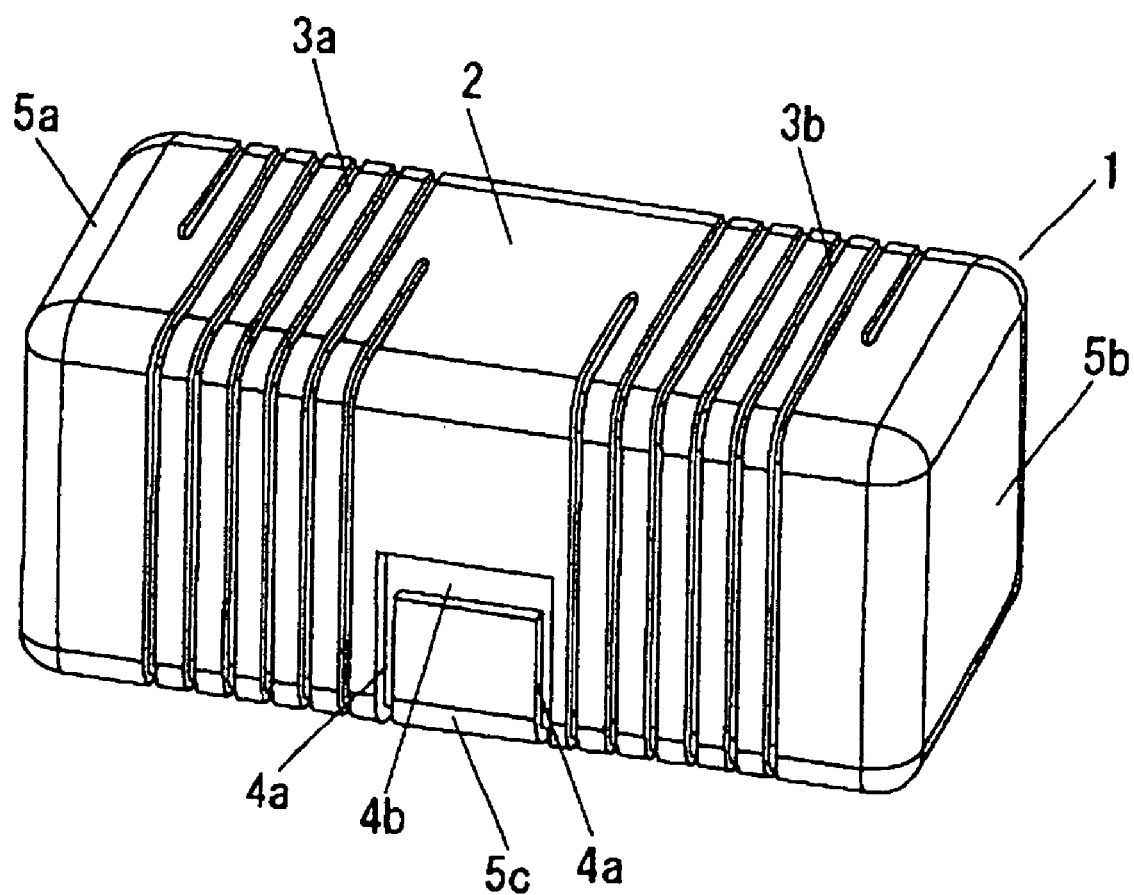

Alternatively, as shown in FIG. 18, the spiral conductor portions 3a, 3b may be placed in positions of 180-degree mirror symmetry about the third terminal portion 5c, respectively. When the directionalities of the magnetic field directions of the inductance components generated respectively by the spiral conductor portions 3a, 3b are changed, the coupling force of the magnetic coupling between the inductances can be adjusted.

Alternatively, two or more spiral conductor portions 3a, 3b may be disposed between the first and second terminal portions 5a and 5b, and the third terminal portion 5c. When inductances are placed in series, there is an advantage that the impedance value can be increased.

Next, the second groove portions 4a, 4b will be described.

Each of the second groove portions 4a, 4b is formed by working a conductive film formed on the surface of the substrate 2 with a process such as laser trimming, grindstone working, ion beam machining, or photolithography. A coupling capacitance is generated via the second groove portions 4a, 4b.

These groove portions are formed by a groove forming technique such as trimming. When the widths and depths of the grooves are adequately changed, the capacitor value generated by the capacitance coupling due to the second groove portions 4a, 4b can be changed. When these values are adequately adjusted, therefore, it is possible to obtain a desired capacitance.

The second groove portions 4a, 4b are circumferentially disposed so as to completely block electrical connection between the third terminal portion 5c and the other portions of the substrate 2, so that, on the substrate 2, the third terminal portion 5c is in the state where it is completely electrically independent from the surrounding.

According to the configuration, the third terminal portion 5c is electrically isolated from the other portions of the substrate 2, and the first and second terminal portions are electrically connected to each other.

Namely, the pair of the first and second terminal portions disposed on the substrate 2 are electrically connected to each other, and the third terminal portion is not electrically connected to the other portions (including the first and second terminal portions). Unlike Embodiment 1, 2, the first to third terminal portions are not in the state where all of the terminal portions are electrically disconnected from one another. According to this structure, a low-pass filter through which only a low-frequency band can be passed is formed by the substrate 2 which is a single element.

FIG. 20 shows the case where the substrate 2 is partly stepped down. Because of the stepped down portions, the spiral conductor portions 3a, 3b are not in direct contact with the circuit board, and hence it is possible to avoid effects and the like on the inductor component from occurring. When the protective film 7 which will be described later is formed in the stepped down portions, the surface level of the protective film 7 is constant, and hence there is an advantage that the mounting property is excellent. Since the stepped down portions are disposed, the protective film 7 can be made thicker, and hence there is a further advantage that the durability can be enhanced.

In the case where, as shown in FIG. 20, the substrate 2 is stepped down in the portion other than the first and second terminal portions 5a and 5b and the third terminal portion 5c, preferably, the third terminal portion 5c is not stepped down, or remains unprocessed in order to ensure the grounding connection.

Preferably, the levels (the levels in the side of the mounting surface) of the third terminal portion 5c and the first and second terminal portions 5a and 5b are made equal to one another, so that the electronic component can be mounted surely and easily on a circuit board.

Next, the case where the protective film and the like are formed will be described with reference to FIG. 19.

The reference numeral 7 denotes the protective film, and 8, 9, 10 denote bonding films. The protective film 7 is disposed so as to cover at least the spiral conductor portions 3a, 3b, and the second groove portions 4a, 4b. Of course, the protective film 7 may be disposed on the whole periphery of the substrate 2 excluding the first and second terminal portions 5a and 5b, and the third terminal portion 5c. The protective film 7 is made of an insulative material. A resin or ceramic is preferably used as the material. Specific examples are a resin material such as an epoxy resin, and an insulating film of silicon oxide or the like.

The protective film 7 is formed by any one of various methods including application, electrodeposition, and electrostatic coating. Alternatively, the protective film may be formed by using a tubular protective film. The tubular protective film can be realized by attaching a protective film having a tubular shape to the periphery of the substrate 2, and then applying heat to cause the film to be in close contact with the substrate. The tubular protective film is formed so as to cover the spiral conductor portions 3a, 3b, and the second groove portions 4a, 4b, and hence the protective film does not flows into grooves of the spiral conductor portions 3a, 3b and the second groove portions 4a, 4b. Therefore, the inductor characteristics are not varied by the disposition of the tubular protective film. Preferably, a material which is made of a resin and heat-shrinkable is selected as the material of the tubular protective film because of the following reason. When the substrate 2 is covered by such a tubular protective film and a heat treatment is applied to the film, the tubular film shrinks so that the tubular protective film can be surely formed on the substrate 2.

As the coating composition, preferably, one of an electrodepositable coating composition, a transfer coating composition, glass, and low-temperature fired ceramics is used, or a combination of these materials is used.

Since the protective film 7 is disposed, the conductive film of the substrate 2, the spiral conductor portions 3a, 3b, the grooves of the second groove portions 4a, 4b, and the like can be prevented from being damaged. Particularly, they can be protected from shocks and heat during transportation and a mounting process.

The bonding films 8, 9, 10 are configured by so-called lead-free solder in which only Sn is used or elements other than lead are added to Sn. In the embodiment, the bonding films are disposed in order to improve the bonding property in, for example, a process of mounting the electronic component onto a circuit board. In the case where the bonding property is sufficiently attained by the first and second terminal portions 5a and 5b and the third terminal portion 5c, it is not necessary to dispose the bonding films 8, 9, 10.

More preferably, a film of nickel or a nickel alloy may be disposed between the first and second terminal portions 5a and 5b, the third terminal portion 5c, and the bonding films 8, 9, 10 in order to prevent solder leaching from occurring, and improve, for example, the weather resistance of the first and second terminal portions 5a, 5b and the third terminal portion 5c.

Next, the inner layer conductor 18 will be described.

The inner layer conductor 18 enables the position of a pole generated in an attenuation curve showing filter characteristics, to be easily adjusted without affecting the cutoff frequency.

The performance can be improved by adjusting the frequency where a pole is generated. This was found by the inventor as a result of various experiments, etc.

The inner layer conductor 18 has a function of attenuating a part of magnetic fluxes generated by the spiral conductor portions 3a, 3b, whereby the condition of the frequency where a pole is generated can be changed as described later.

The inner layer conductor 18 is formed inside the substrate 2, and not electrically connected to portions such as the conductive film formed on the surface of the substrate 2, or is an independent conductor. In order to attenuate magnetic fluxes in a balanced manner, preferably, the inner layer conductor 18 is placed substantially in the middle of the substrate 2 as shown in FIG. 25A to 25C. However, the inner layer conductor may be placed in a position other than the middle, and shifted in either of the lengthwise direction or the widthwise direction of the substrate 2. The inner layer conductor may be approximately parallel to one of the faces of the substrate 2, or may be inclined.

Alternatively, the inner layer conductor may not be placed in the middle of the substrate 2, and may be placed in a shifted position, or may be shifted in the lengthwise direction or in the widthwise direction.

Since the inner layer conductor is used for attenuating magnetic fluxes, it is preferably placed in a position opposed to the spiral conductor portions 3a, 3b. However, the inner layer conductor may be placed with being slightly shifted from the position. It may be preferable to adjust the degree of attenuation of magnetic fluxes by placing the inner layer conductor with being slightly shifted. Even in the case where plural spiral conductor portions 3a, 3b are used, the inner layer conductor 18 may be formed by a single member such as a plate, paste, a printed face, or a pattern. Alternatively, the inner layer conductor may be formed in a number which is equal to or different from that of the spiral conductor portions 3a, 3b.

The area of the inner layer conductor is adequately determined so as to attenuate magnetic fluxes generated by the spiral conductor portions 3a, 3b. As the area is larger, the magnetic fluxes are attenuated by a larger degree. By contrast, when the attenuation amount is to be reduced, the area may be reduced. The attenuation amount can be adjusted by the thickness or material of the inner layer conductor.

Alternatively, the inner layer conductor 18 may not be formed as a single member, but as plural members, and may be formed by a prism-like member in place of a plate-like member.

These alternatives are shown in, for example, FIGS. 25B and 25C.

The electronic component may be formed by inserting the inner layer conductor 18 into the substrate 2 and then firing the substrate, or by stacking two separate laminations.

The material of the inner layer conductor 18 may be a metal such as gold, silver, copper, platinum, or palladium, or an alloy of such metals.

The inner layer conductor 18 can be realized by printing in a laminated member a platinum or tungsten electrode in which diffusion hardly advances at the firing temperature of the substrate material. In the case where a low-temperature fired material such as glass ceramics is used as the material of the substrate 2, a silver electrode or a copper electrode may be used.

Next, the operation and function of the thus configured electronic component will be described with reference to the equivalent circuit diagrams, etc.

The inductor component is generated by the spiral conductor portions 3a, 3b, and the capacitor component is generated by the second groove portions 4a, 4b, etc. The operation as a filter is realized by the inductor component (L) and the capacitor component (C).

FIGS. 21 and 22 show equivalent circuits of electronic components according to the invention. In the figures, inductor and capacitor components produced by various portions are indicated.

FIG. 21 shows an equivalent circuit of the electronic component 1 shown in FIG. 17.

The inductor value of the spiral conductor portion 3a is L1, that of the spiral conductor portion 3b is L2, and the coupling capacitor in the second groove portions 4a, 4b between the two or first and second terminal portions 5a and 5b and the third terminal portion 5c is C1.

The two or first and second terminal portions 5a and 5b are electrically connected to each other through the spiral conductor portions 3a, 3b, and the spiral conductor portions 3a, 3b are electrically connected to each other by a conductor 2. The equivalent circuit is configured as a low-pass filter of a T-circuit having the coupling capacitor in the third terminal portion 5c which is made independent by the second groove portions 4a, 4b. The impedance of the inductor and the capacitor is indicated as follows, and the cutoff frequency of the low-pass filter can be adjusted by the inductor value and the coupling capacitor value.

$$Z = \omega L \qquad [\text{Exp. 3}]$$

$$Z = \frac{1}{\omega C} \qquad [\text{Exp. 4}]$$

The resonance frequency is determined by the following expression.

$$f_0 = \frac{1}{2\pi\sqrt{LC}} \qquad [\text{Exp. 2}]$$

When the composite LC circuit 1 is mounted in a signal line, a signal is input to one of the first and second terminal portions 5a and 5b, and a signal is output from the other one of the terminal portions, the circuit functions as a low-pass filter through which only a signal in a specific frequency band can be passed. When the third terminal portion 5c is grounded, a signal of a frequency which is equal to or higher than the pass band can be surely eliminated.

The spiral conductor portions 3a, 3b have an inductance component, and electric field coupling occurs between spiral lines. As shown in FIG. 22, capacitances Cp1, Cp2 which are connected in parallel to the inductances in the equivalent circuit are generated as parasitic capacitances. An input signal is divided into a signal which passes through the capacitance Cp1, and that which passes through the inductance L1. In the two paths, the phase in the inductance portion is changed by 90 deg., and that in the capacitance portion is changed by −90 deg. The signals which are to be again combined with each other are anti-phase signals which are different in phase by 180 deg., and are 0 in level at the resonance frequency fr1 of the parallel resonance circuit of Cp1 and L1. The resonance frequency fr1 is calculated by (Exp. 3) showing the resonance condition. Similarly, signals which pass Cp2 and the inductance L2, respectively are 0 in level at the resonance frequency fr2 of the parallel resonance circuit of Cp2 and L2 (also the resonance frequency fr2 is calculated by (Exp. 3)). As a result, the filter characteristics are attenuation characteristics having poles at frequencies fr1 and fr2. Because of the formation of the poles, it is possible to adjust the attenuation curve which is important as the filter characteristics. For example, the electronic component is configured as a filter having a more intense attenuation curve or a less intense attenuation curve.

Next, experimental results will be described that show a phenomenon in which the pole generation can be adjusted and the filter performance is improved by enabling the electronic component 1 of the invention to operate as a low-pass filter and further disposing the inner layer conductor 18.

FIG. 23 shows results of experiments which were conducted with using the electronic component 1 as a low-pass filter, and under the conditions indicated in FIG. 21 showing the equivalent circuit. As seen from FIG. 23, the electronic component operates as a low-pass filter through which a signal lower than the vicinity of 6 GHz can be band-passed. At a double or higher frequency, attenuation of about 15 dB or more occurs, and hence the electronic component has enough performance to operate as a low-pass filter.

The inductance values L1, L2 and the capacitor value C1 can be adjusted. When the electronic component is used as a low-pass filter, therefore, the cutoff frequency can be changed.

FIG. 24 shows results of experiments which were further conducted under the conditions indicated in FIG. 22 showing the equivalent circuit. As seen from FIG. 23, low-pass characteristics which are similar to those of FIG. 23 are obtained, but an attenuation pole is generated in the vicinity of 14 GHz, and, at a double or higher frequency, attenuation of about 30 dB or more occurs. The characteristics as a low-pass filter are improved. This improvement is an effect due to the inner layer conductor 18.

Since Cp1, Cp2 are parasitic capacitances, they are hardly changed. When the inner layer conductor 18 is formed inside the substrate as shown in FIG. 25A to 25C to reduce the magnetic field generated by the spiral conductor portions 3a, 3b, the frequencies fr1, fr2 where a pole is generated can be easily changed simply by minutely changing the inductance values L1, L2 without requiring the capacitor components Cp1, Cp2 (the both components are cumbersomely adjusted) which are parallel to the inductance values.

Figure 26:
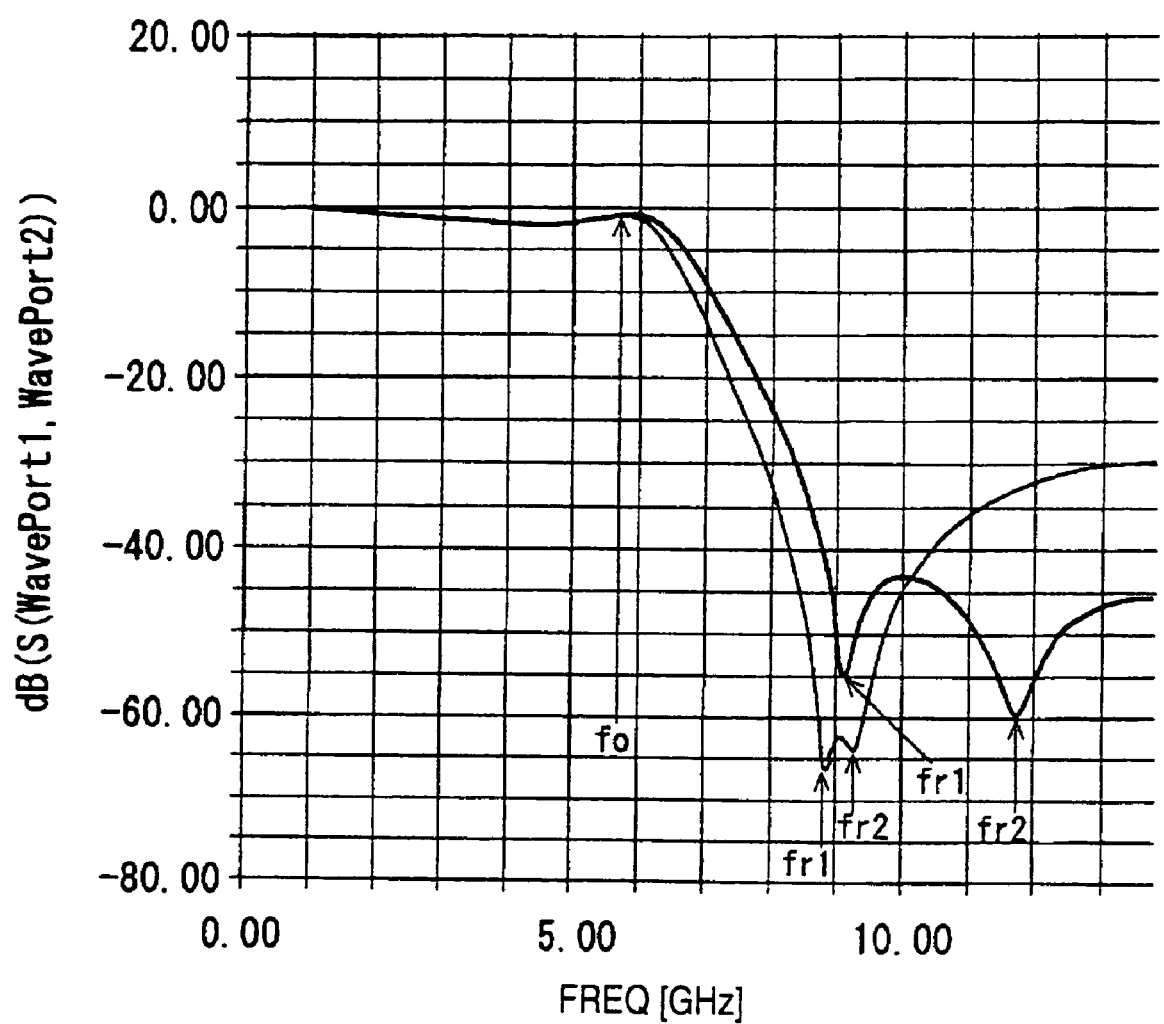
FIG. 26 shows results of experiments in which the length PL of the inner layer conductor was changed.

At this time, Cp1, Cp2 are very smaller than the capacitor values C1, C2, and hence f0 is not affected by minute changes of the inductance values L1, L2. FIG. 26 shows results of experiments in which the length PL of the inner layer conductor was changed. As seen from FIG. 26, the pole positions fr1 and fr2 can be largely changed without changing the cutoff frequency f0, so that the attenuation characteristics can be improved.

As seen from the experimental results, according to the composite LC filter according to the invention, a high-performance low-pass filter is realized to which also the function of controlling the frequency where a pole is generated can be added.

In the conventional art, the minimum size of an electronic component is 1608 size of a multilayer LC filter. By contrast, according to the embodiment of the invention, in 1005 size or 0603 size, it is possible to attain an inductance of 1 to 56 nH in the spiral conductor portions. In the case where ceramics having a specific dielectric constant of 1 to 150 is used as the material of the substrate, when the gap portion has a width of 0.01 to 0.1 mm, it is possible to attain a capacitance of 0.1 to 10 pF. Therefore, an electronic component of an ultra small size or 0603 size can be realized, so that a filter can be configured by a component which is very smaller than a conventional multilayer LC filter.

Hereinafter, mounting of the electronic component will be described.

Figure 27:
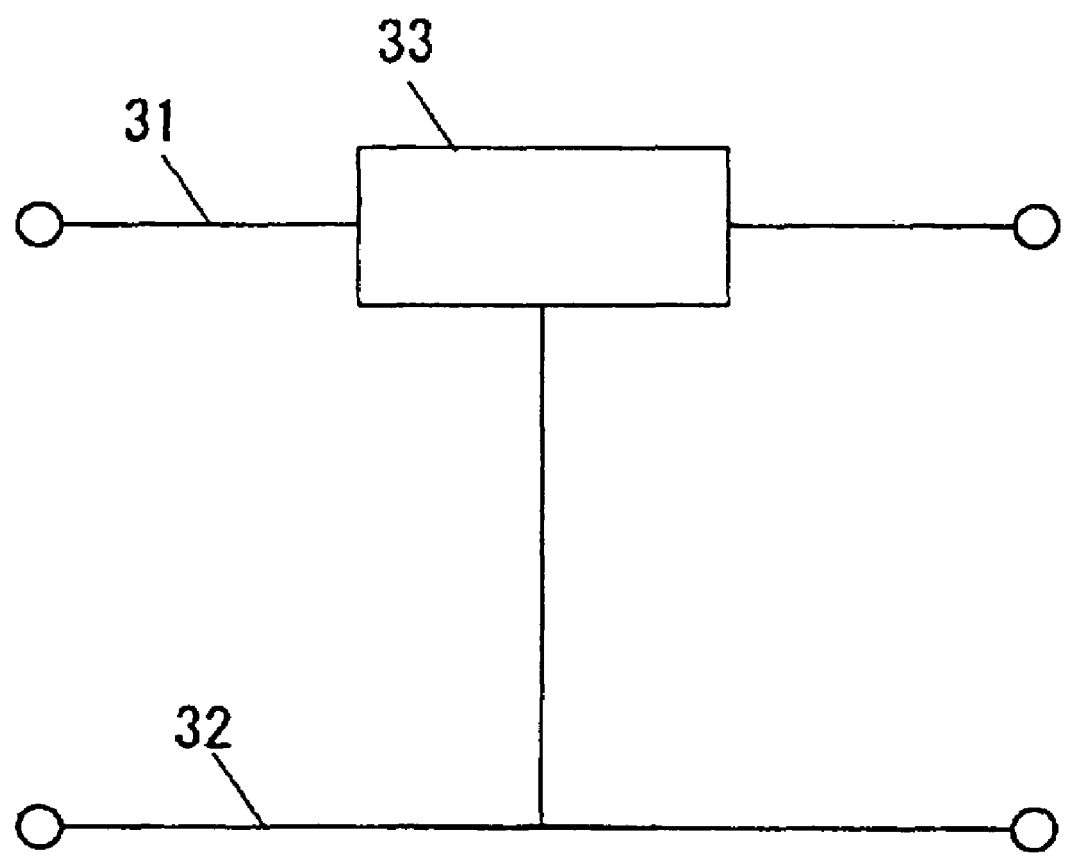
FIG. 27 is a diagram showing a part of an electronic circuit in Embodiment of the invention.

FIG. 27 is a diagram showing a part of an electronic circuit in Embodiment of the invention. The figure shows a part of an electronic circuit of one of various electronic apparatuses such as a wireless terminal. The reference numeral 31 denotes a signal line, 32 denotes a ground line, and 33 denotes the electronic component of Embodiment. Referring to FIG. 27, the first and second terminal portions 5a and 5b of the electronic component 33 are connected to the signal line 31 to constitute a circuit which applies a filtering process having the pass band center frequency at the resonance frequency of the electronic component of the invention, on an incoming signal, and which then outputs the resulting signal. The third terminal portion 5c is connected to the ground line 32 to short-circuit an unwanted signal to the ground.

Because of such a circuit, the electronic component can be used as a low-pass filter for eliminating noises or harmonics in an amplifier. In this case, the electronic component 33 can be configured into an ultra small size, and hence also the electronic circuit can be miniaturized. As a result, the size of the electronic apparatus into which the electronic circuit is incorporated can be reduced. Since the electronic component is produced with a high yield and at a low cost, cost reduction of the electronic apparatus can be realized, and an operation failure after mounting, and the like can be reduced, so that the reliability of the electronic apparatus can be enhanced. As described above, the electronic component of Embodiment 3 can be optimally used in an electronic apparatus in which a low-pass filter must be mounted.

Unlike a laminated electronic component in which an indictor is configured inside a laminated portion and the laminated portion is used as a capacitor component, the capacitor and inductor values can be determined by a trimming process as described above, and hence the values can be easily adjusted. Particularly, the capacitor and inductor values can be simultaneously determined by a trimming step, and an indictor and a capacitor can be formed by the same process. As compared with a laminated electronic component in which an indictor is formed by transferring or printing, and complex steps such as lamination are then required, therefore, the steps can be very simplified. The simplified steps can suppress dispersion and realize a reduced cost.

Since a trimming process which is accurate means is used, a highly accurate component can be realized, and dispersion of the capacitor and inductor values which is inevitably caused in the case of lamination can be reduced, with the result that the yield is high and cost reduction can be easily realized. Furthermore, there is an advantage that determination and fine adjustment of the capacitor component can be easily conducted. As seen from the experimental results, the disposition of the inner layer conductor 18 enables the pole position to be easily changed without changing the pass band frequency, and hence the filter characteristics such as attenuation characteristics can be sufficiently improved.

In a conventional electronic component having an inductor and a capacitance, a laminated structure is employed in order to put emphasis on ensuring of the capacitor component, and therefore the number of production steps is large, the cost is high, and the accuracy is dispersed by a firing process or the like. By contrast, it is possible to realize an electronic component which has an inductor and a capacitance, and in which the production steps can be simplified and an accurate inductor component can be sufficiently ensured.

As described above, it is possible to realize an electronic component in which the yield is high and the cost is low, and which has an ultra small size and highly accurate filter characteristics.

(Embodiment 4)

Next, methods of producing an electronic component will be described.

Figure 28:
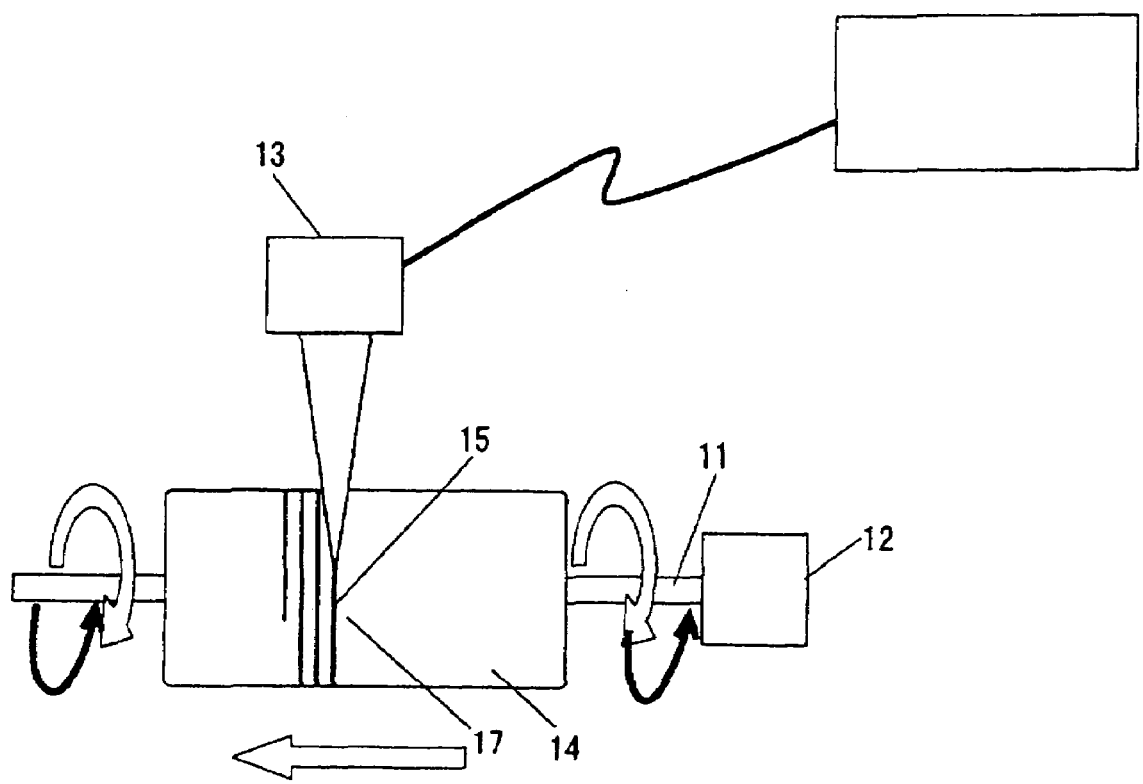
FIGS. 28 and 29 are diagrams showing methods of producing the electronic component according to Embodiment 4 of the invention.
Figure 29:
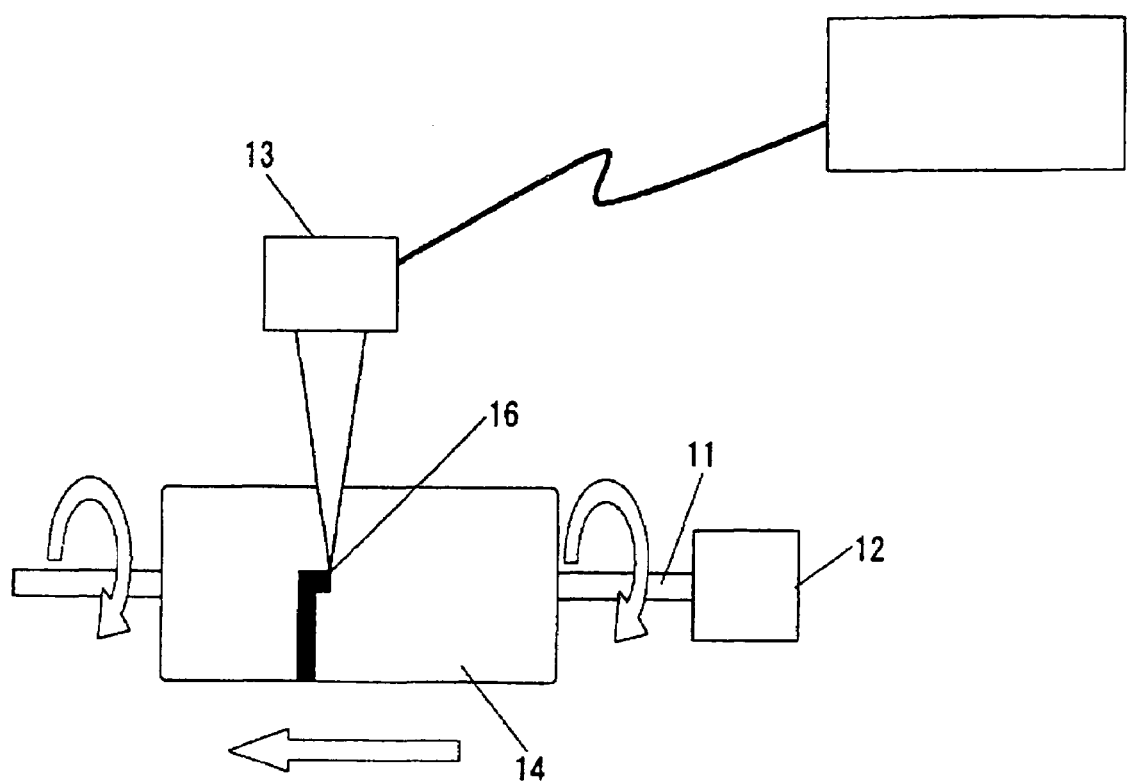
Figure 30:
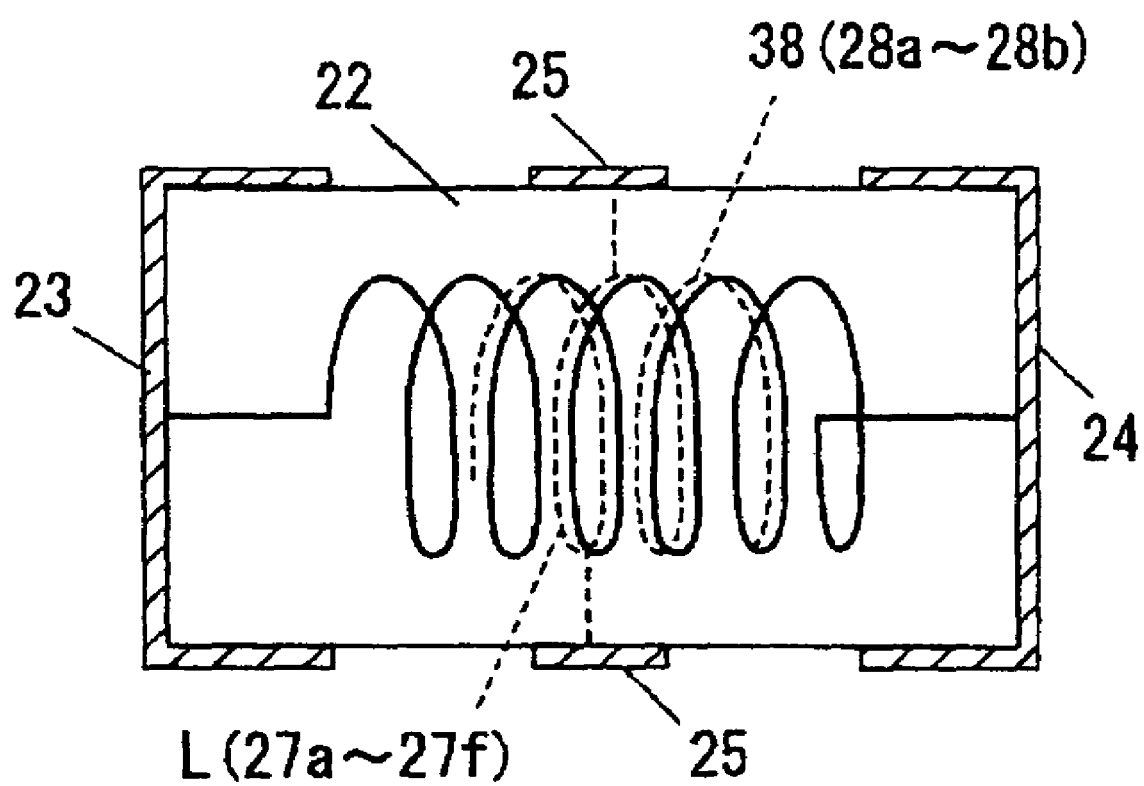
FIG. 30 is a section view of a multilayer LC filter of the conventional art.
Figure 31:
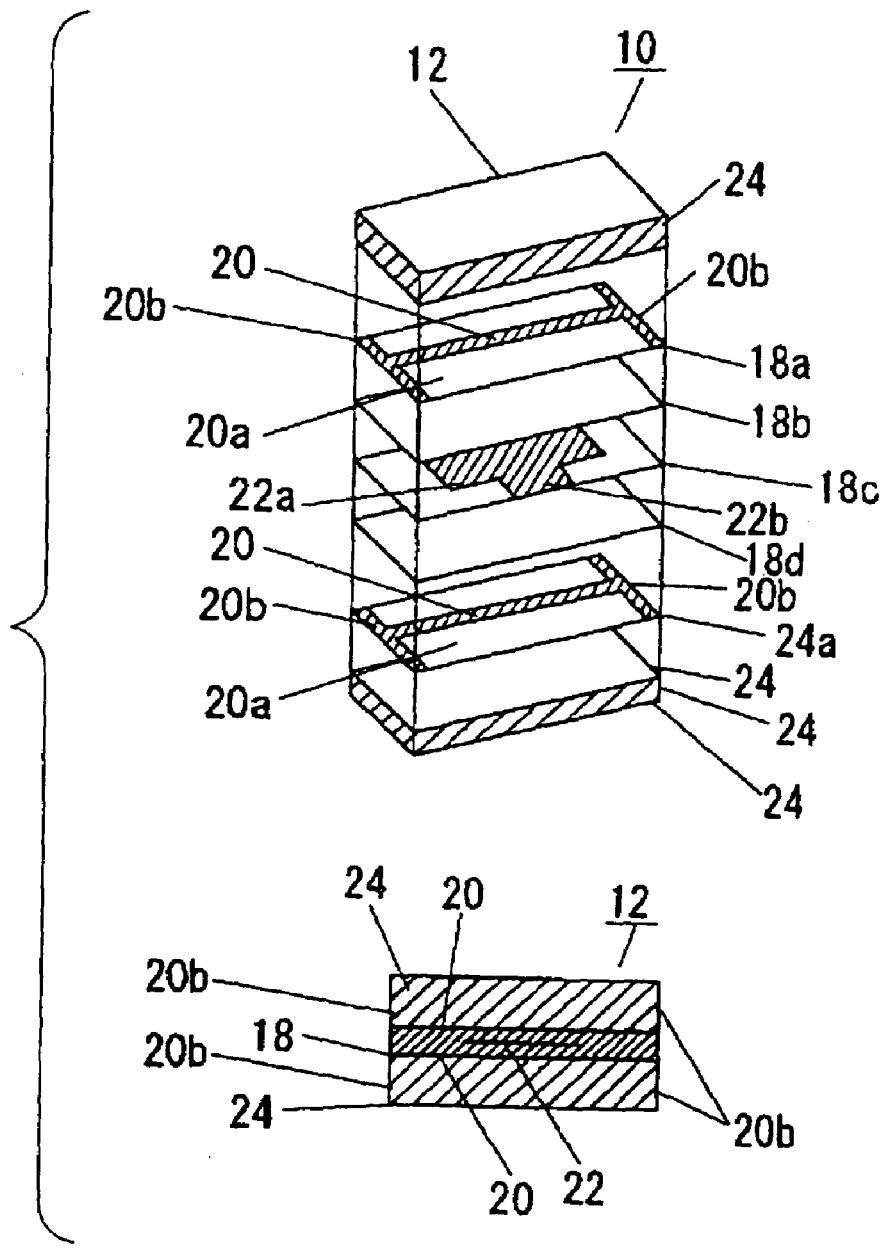
FIG. 31 is a perspective view of a multilayer LC filter of the conventional art.

FIGS. 28 and 29 are diagrams showing methods of producing the electronic component of Embodiment 4 of the invention.

The reference numeral 11 denotes a rotary support table, 12 denotes a motor, 13 denotes a laser irradiation apparatus, 14 denotes a conductive film-covered substrate, and 15 denotes a spiral groove. As described in Embodiment 1, the conductive film-covered substrate 14 is formed by applying a process such as a pressing process or an extruding process on an insulative or dielectric material such as alumina or an alumina-based ceramic material. The conductive film of the conductive film-covered substrate 14 is formed by laminating one or more layers of conductive films made of a conductive material such as copper, silver, gold, or nickel.

As shown in FIG. 28, the conductive film-covered substrate 14 is placed on the rotary support table 11, the rotary support table is rotated by the motor 12, the conductive film-covered substrate 14 is irradiated with a laser beam emitted from the laser irradiation apparatus 13, and at least one of the laser irradiation apparatus 13 and the rotary support table 11 is moved to form the spiral groove 15. At this time, the spiral groove 15 is cut so as to surely exceed the conductive film, and the conductive film having spiral shape remains. As a result, the spiral conductor portions 3a, 3b having the spiral conductive film is formed. When the motor 12 is configured so as to reversely rotate, it is possible to form plural spirals in a mirror symmetrical manner.

As shown in FIG. 29, alternatively, the conductive film-covered substrate 14 is placed on the rotary support table 11, the rotary support table is rotated by the motor 12, the conductive film-covered substrate 14 is intermittently irradiated with a laser beam emitted from the laser irradiation apparatus 13, and at least one of the laser irradiation apparatus 13 and the rotary support table 11 is moved to form the first and second groove portions. At this time, the first and second groove portions are cut so as to surely exceed the conductive film, and the independent conductive film remains. As a result, the third terminal portion 5c is formed.

In the operations of FIGS. 28 and 29, when the ON/OFF operation of the laser irradiation, the rotation of the motor, and the movement of at least one of the laser irradiation apparatus 13 and the rotary support table 11 are program-controlled, plural spiral conductor portions can be configured on the same substrate.

The spiral groove 15 is formed over a constant width, and the laser irradiation by the laser irradiation apparatus 13 is then stopped, whereby a conductor portion 17 in which the spiral groove 15 is not formed is formed on the conductive film-covered substrate 14. When this process is repeated a desired number of times, plural spiral conductor portions 15 having the spiral groove 15, and plural conductor portions 17 are alternately formed. In place of laser irradiation, a cutting process using grinding stone may be employed. When only one spiral portion is to be formed, this configuration can be realized by conducting the laser irradiation on only one place, and then stopping the laser irradiation.

As described above, the first to third terminal portions, the first groove portion, the second groove portion, and the spiral conductor portion are formed on the substrate on which the conductor film is formed, whereby an electronic component of frequency characteristics of a band-pass filter such as described in Embodiments 1, 2, or that of frequency characteristics of a low-pass filter such as described in Embodiment 3 is produced.

This application is based upon and claims the benefit of priority of Japanese Patent Applications No. 2003-306658 filed on Aug. 29, 2003, No. 2004-049665 field on Feb. 25, 2004 and No. 2004-164212 filed on Jun. 2, 2004, the contents of which are incorporated herein by reference in its entirety.

What is claimed is:

1. A band-pass filter comprising:

a substrate;

a first terminal disposed on a first end of the substrate;

a second terminal disposed on a second end of the substrate, wherein said substrate has a circular groove disposed between the first terminal and the second terminal;

a first spiral conductor formed on the substrate between the first terminal and the groove; and a second spiral conductor formed on the substrate between the second terminal and the groove, wherein:

a first portion of the substrate at which said groove is located functions as a capacitor, said first spiral conductor and a portion of said substrate at which said first spiral conductor is formed function as a first coil, said second spiral conductor and a portion of said substrate at which said second spiral conductor is formed function as a second coil, and the first coil, the capacitor and the second coil are connected in that order to each other in series between the first terminal and the second terminal.

2. A band-pass filter according to claim 1, wherein the first spiral conductor and the second spiral conductor are placed rotation-symmetrically about the groove.

3. A band-pass filter according to claim 1, wherein the first spiral conductor and the second spiral conductor are placed mirror-symmetrically about the groove.

4. A band-pass filter according to claim 1, wherein said substrate has an approximately prism shape comprising one of a triangular prism shape, a rectangular prism shape and a polygonal prism shape.

5. A band-pass filter according to claim 1, further comprising a protective film disposed on the substrate to cover at least the first spiral conductor and the second spiral conductor and the groove, said protective film being formed by an applied coating composition, a tubular resin, or an electro-deposited film.

6. A band-pass filter according to claim 1, wherein the protective film is formed by an applied coating composition that includes at least one of an electro-depositable coating composition, a transfer coating composition, glass, and low-temperature fired ceramics.

7. A band-pass filter according to claim 1, wherein the substrate is made from ceramics that has a dielectric constant of 1 to 150.

8. A band-pass filter according to claim 1, wherein the first terminal and the second terminal are connected to signal lines.

9. A band-pass filter according to claim 1, wherein the first spiral conductor and the second spiral conductor and the groove are formed on a same surface of the substrate.

* * * * *